(12) United States Patent
Ehrne et al.

(10) Patent No.: US 11,282,725 B2
(45) Date of Patent: Mar. 22, 2022

(54) WAFER TRANSFER UNIT AND WAFER TRANSFER SYSTEM

(71) Applicant: VAT Holding AG, Haag (CH)

(72) Inventors: Florian Ehrne, Fruemsen (CH); Martin Netzer, Bludenz (AT); Andreas Hofer, Widnau (CH); Eligio Belleri, Balzers (LI); Marco Apolloni, Marbach (CH); Thomas L. Swain, Walnut Creek, CA (US)

(73) Assignee: VAT Holding AG, Haag (CH)

( * ) Notice: Subject to any disclaimer, the term of this patent is extended or adjusted under 35 U.S.C. 154(b) by 73 days.

(21) Appl. No.: 16/421,746

(22) Filed: May 24, 2019

(65) Prior Publication Data
US 2019/0378734 A1     Dec. 12, 2019

(30) Foreign Application Priority Data

Jun. 8, 2018 (DE) ...................... 10 2018 113 786.9

(51) Int. Cl.
*H01L 21/67* (2006.01)
*G06N 20/00* (2019.01)
(Continued)

(52) U.S. Cl.
CPC ....... *H01L 21/67253* (2013.01); *G06N 20/00* (2019.01); *H01L 21/67259* (2013.01);
(Continued)

(58) Field of Classification Search
CPC ......... H01L 21/67253; H01L 21/67736; H01L 21/67259; H01L 21/67393;
(Continued)

(56) References Cited

U.S. PATENT DOCUMENTS 5,859,964 A * 1/1999 Wang ...................... H01L 22/20
                                                                    714/48
7,027,894 B2 * 4/2006 Kretz ..................... B25J 13/087
                                                                    414/935
(Continued)

FOREIGN PATENT DOCUMENTS

DE      600 35 164 T2    2/2008
EP       1 102 137 B1    6/2007
(Continued)

OTHER PUBLICATIONS

Search Report dated Mar. 18, 2019 issued in corresponding German patent application No. 10 2018 113 786.9 (and partial English translation).

*Primary Examiner* — Benjamin Tzu-Hung Liu
(74) *Attorney, Agent, or Firm* — Posz Law Group, PLC

(57) ABSTRACT

A wafer transfer unit includes at least one data processing unit, which is configured at least for a registration and/or processing of sensor data of at least one sensor, allocated to at least one sub-component of a wafer transfer system, of a sensor module, in particular includes at least one wafer processing module of the wafer transfer system, includes at least one wafer interface system of the wafer transfer system with a wafer transport container and a loading and/or unloading station for a loading and/or unloading of the wafer transport container and/or of the wafer processing module, includes at least one wafer transport container transport system of the wafer transfer system and/or includes at least one wafer handling robot of the wafer transfer system.

6 Claims, 6 Drawing Sheets

Figure 1:
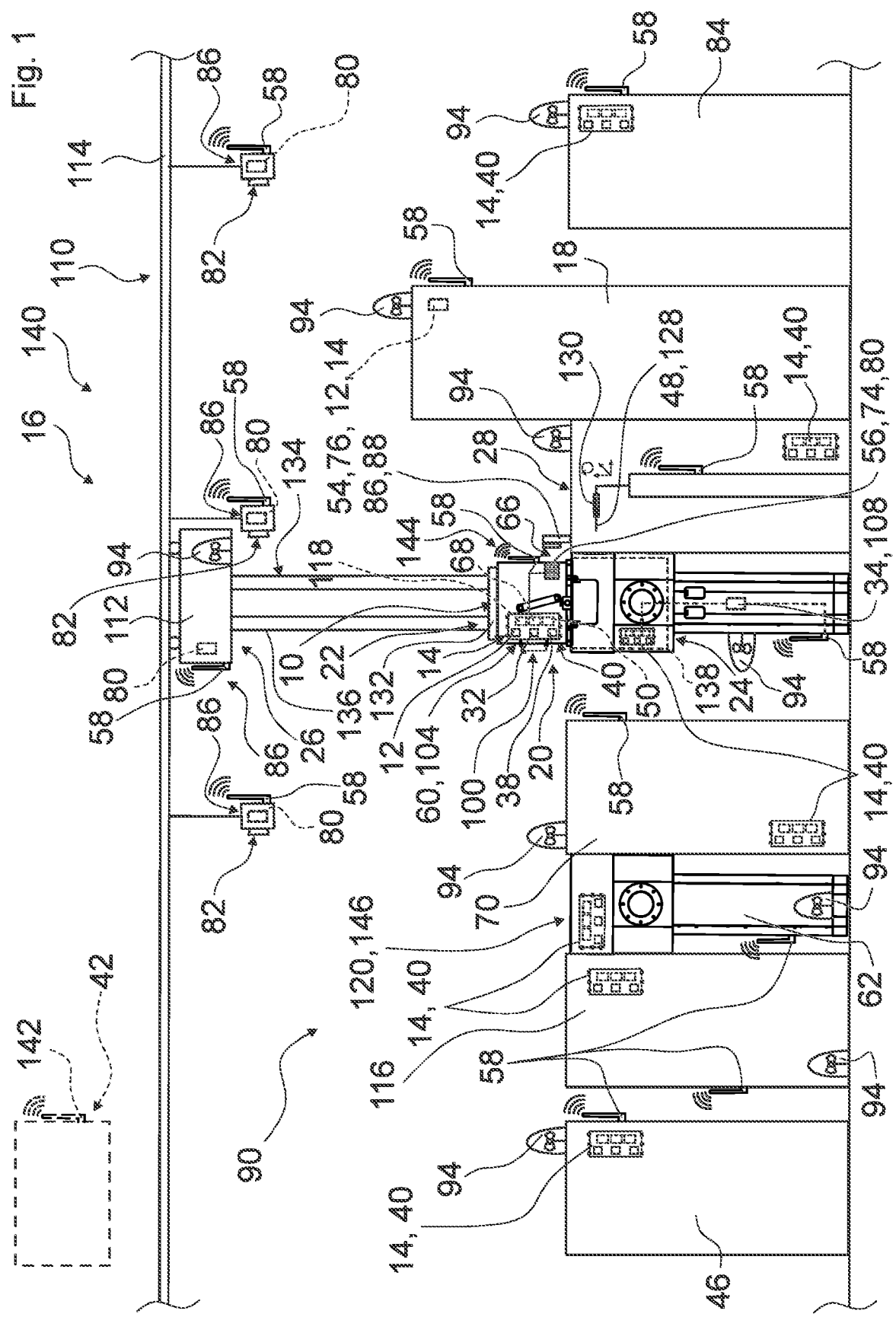

(51) Int. Cl.
*H01L 21/673* (2006.01)
*H01L 21/677* (2006.01)
*H04B 5/00* (2006.01)

(52) U.S. Cl.
CPC .. *H01L 21/67393* (2013.01); *H01L 21/67736* (2013.01); *H01L 21/67778* (2013.01); *H04B 5/0031* (2013.01)

(58) Field of Classification Search
CPC ......... H01L 21/67778; H01L 21/67288; H01L 21/67294; H01L 21/67276; H01L 21/677; H01L 21/67742; H01L 21/67766; G06N 20/00; H04B 5/0031; B65G 49/07
See application file for complete search history.

(56) References Cited

U.S. PATENT DOCUMENTS

| | | | |
|---|---|---|---|
| 2002/0130789 A1* | 9/2002 | Kano | G01K 1/024 340/870.16 |
| 2002/0132480 A1 | 9/2002 | Shindo et al. | |
| 2002/0187025 A1 | 12/2002 | Speasl et al. | |
| 2004/0182472 A1* | 9/2004 | Aggarwal | H01L 21/67393 141/98 |
| 2008/0164838 A1* | 7/2008 | Maher | H02J 7/025 320/108 |
| 2008/0246499 A1* | 10/2008 | Kollwitz | G01R 31/2891 324/750.28 |
| 2011/0015773 A1* | 1/2011 | Wilby | H01L 21/67253 700/109 |
| 2011/0114534 A1* | 5/2011 | Watson | H01L 21/67393 206/710 |
| 2013/0085595 A1* | 4/2013 | Kiley | H01L 21/68 700/121 |
| 2016/0083843 A1* | 3/2016 | Yamamoto | C23C 16/4412 118/704 |
| 2017/0004987 A1* | 1/2017 | Fairbairn | H01L 21/67259 |
| 2017/0110354 A1* | 4/2017 | Daugherty | H01L 21/67196 |
| 2017/0117170 A1* | 4/2017 | Wong | H01L 21/67201 |
| 2018/0048169 A1* | 2/2018 | Bello | H01L 21/6773 |
| 2018/0284735 A1* | 10/2018 | Celia | G06N 3/02 |
| 2019/0099886 A1* | 4/2019 | Chattopadhyay | B25J 9/1674 |
| 2019/0163170 A1* | 5/2019 | Hsu | H01L 21/67727 |
| 2019/0164792 A1* | 5/2019 | Huang | H01L 21/02079 |
| 2019/0371636 A1* | 12/2019 | Huang | G05B 19/41875 |

FOREIGN PATENT DOCUMENTS

| | | | |
|---|---|---|---|
| JP | 2005032907 | * | 2/2005 |
| WO | 98/59229 A2 | | 12/1998 |

* cited by examiner

WAFER TRANSFER UNIT AND WAFER TRANSFER SYSTEM

CROSS REFERENCE TO RELATED APPLICATION

This application is based on and incorporates herein by reference German Patent Application No. 10 2018 113 786.9 filed on Jun. 8, 2018.

PRIOR ART

The invention relates to a wafer transfer unit as claimed in claim 1, a wafer transport container having a wafer transfer unit as claimed in claim 42, a loading and/or unloading station having a wafer transfer unit as claimed in claim 51, a wafer transfer system having the wafer transport container and having the loading and/or unloading station as claimed in claim 53, and a method having the wafer transfer unit as claimed in claim 56.

It is the object of the invention in particular to provide a generic device which has advantageous characteristics with regard to a transportation of at least one wafer, storage of at least one wafer and/or a transfer of at least one wafer between sub-components of a wafer transfer system, in particular within a wafer fabrication environment (fab). The object is achieved according to the invention by means of the features of patent claims 1, 42, 51, 53 and 56, whilst advantageous embodiments and refinements of the invention emerge from the subclaims.

Advantages of the Invention

A wafer transfer unit is proposed, comprising at least one data processing unit which is configured at least for a registration and/or processing of sensor data from at least one sensor, assigned to at least one sub-component of a wafer transfer system, of a sensor module, in particular comprising at least one wafer processing module of the wafer transfer system, comprising at least one wafer interface system of the wafer transfer system with a wafer transport container and a loading and/or unloading station for loading and/or unloading of the wafer transport container and/or of the wafer processing module, comprising at least one wafer transport container transport system of the wafer transfer system and/or comprising at least one wafer handling robot of the wafer transfer system. In this way, it is possible in particular to provide advantageous characteristics with regard to a transportation of at least one wafer, a storage of at least one wafer and/or a transfer of at least one wafer between sub-components of a wafer transport system, in particular within a fab. Furthermore, monitoring of the wafer and/or of the environmental conditions around the wafer can advantageously be made possible, whereby it is possible in particular for faults, for example production faults, damage to wafers and/or impurities of wafers to be avoided. In this way, it is advantageously possible for waste to be reduced, whereby it is possible in particular for efficiency, in particular cost efficiency and/or unit quantity efficiency, to be increased.

A "wafer transfer unit" is in particular to mean a unit, preferentially an electronic unit, which is configured for controlling, regulating and/or monitoring at least a transfer of at least one wafer between at least two sub-components of the wafer transfer system and/or at least a transportation of at least one wafer within at least one sub-component of the wafer transfer system. In particular, the wafer transfer unit is implemented as a wafer state checking device and/or as a wafer environmental conditions checking device. A "data processing unit" is in particular to mean at least an electronic data processing installation, in particular at least a computer and/or a system of computers, which processes data, in particular data obtained by means of the sensor module, preferably by means of programmable calculation rules.

The data processing unit preferably comprises a plurality of individual computers embodied separately from one another, which may in particular implement a networked data processing system. In particular, it is conceivable for the data processing unit to have a central computer which is configured for collecting, managing and/or organizing data from the individual computers. Alternatively or in addition, the data processing unit may be incorporated into a central control and/or regulation system of the fab, or implemented at least partially integrally with the central control and/or regulation system of the fab. In particular, the central control and/or regulation system of the fab forms a sub-component of the wafer transfer system. The statement that two units and/or systems and/or modules and/or devices are implemented "partially integrally" is in particular to mean that the units have at least one, in particular at least two, advantageously at least three common elements, which are constituent parts, in particular functionally important constituent parts, of both units and/or systems and/or modules and/or devices. In particular, the individual computers of the data processing system are capable of at least temporarily communicating with one another. In particular, at least a portion of the individual computers is implemented as an embedded system which, in particular in a technical context, is incorporated into at least one sub-component of the wafer transfer system. In particular, the data processing unit, preferably the individual computer, comprises an information input, and information processing means and/or an information output. The data processing unit, preferably the individual computer, advantageously comprises at least one processor, a memory, in particular ROM or flash memory, input and output means, further electrical components, an operating program, regulation routines, control routines and/or calculation routines. The components of the data processing unit, preferably of the individual computer, are preferably arranged on printed circuit boards and/or are advantageously arranged in housings.

A "sensor module" is in particular to mean a module which comprises at least one sensor. The sensor is configured at least for detecting at least one parameter. The parameter is in particular in the form of a physical, chemical and/or geometrical parameter. Alternatively or in addition, the parameter may also be in the form of a variation with respect to time of a physical parameter and/or in the form of a designation, for example an identifier assigned to a wafer. The physical parameter comprises in particular a temperature, a force, an electrical current flow, an electrical resistance, an electrical voltage, a magnetic field, a pressure, a mass, a material quantity, a number, an intensity, in particular radiation intensity, a frequency, an energy, a capacity, a duration, a speed, and acceleration, a jerk, an impetus, a mechanical stress, an electrical field and/or a wavelength. The chemical parameter comprises in particular a material composition, a concentration, in particular a concentration of a gas, for example oxygen, $H_2O$ or the like, a density, a humidity, a pH value and/or a vapor pressure. The geometrical parameter comprises in particular a geometry characteristic of a wafer, for example a length, in particular a diameter, a thickness, a situation, a tilt, a surface condition, a curvature, an angle, a volume and/or an area. It is conceivable for the sensor module to comprise a plurality of sensors which are in particular configured for detecting different parameters.

A "wafer transfer system" is in particular to mean a system which is implemented of components which are configured for manipulating, for example moving and/or processing, at least one wafer. A "wafer processing module" of the wafer transfer system is in particular implemented as a module of the fab, which is configured for performing at least one processing step on the wafer for the purposes of producing a chip. A "wafer interface system" is in particular to mean a system which is implemented of components which are configured, for example by means of a housing and/or shield, for moving, e.g. transporting, reloading and/or rotating, at least one object, in particular at least one wafer, and/or permitting an, in particular protected, movement of the at least one object, in particular of the at least one wafer in particular within the fab and/or within an installation of the fab.

A "wafer transport container" is in particular to mean a transport container having a closable interior space or interior, wherein the interior space or the interior is configured for receiving wafers. In particular, the wafer transport container is configured at least for transporting wafers with a diameter of at least 200 mm, preferably of at least 300 mm and preferably of at least 450 mm. In particular, the wafer transport container is configured at least for transporting at least one wafer, preferably at least three wafers, advantageously at least five wafers, particularly advantageously at least ten wafers, preferably at least 25 wafers and particularly preferably at most one hundred wafers. Alternatively or in addition, the wafer transport container is configured for receiving at least one object implemented to differ from a wafer, for example an exposure mask. In particular, the wafer transport container is implemented to be portable. In particular, the wafer transport container is implemented such that it can be closed in vacuum-tight fashion. Preferably, the wafer transport container is implemented as a vacuum-type wafer transport container, which is configured in particular for providing and/or maintaining a vacuum atmosphere in its interior. In particular, the wafer transport container is configured for storing wafers in the vacuum atmosphere. A "vacuum atmosphere" is in particular to mean an atmosphere whose pressure lies below 300 hPa, preferably below 1 hPa, preferably below $10^{-3}$ hPa and particularly preferably below $10^{-6}$ hPa. In particular, the wafer transport container has, in the vacuum atmosphere, a high level of leak-tightness, wherein, in particular, the leakage rate of the wafer transport container is less than $10^{-4}$ mbar*l/s, preferably less than $10^{-5}$ mbar*l/s, advantageously less than $10^{-6}$ mbar*l/s, particularly advantageously less than $10^{-7}$ mbar*l/s, preferably less than $10^{-8}$ mbar*l/s, and particularly preferably less than $10^{-9}$ mbar*l/s. Alternatively, the wafer transport container may be configured for storing and/or holding wafers in a standard atmosphere and/or in an atmosphere of special composition, for example in a nitrogen atmosphere. In particular, the wafer transport container has an individual computer, implemented as an embedded system, of the data processing system.

In particular, the wafer transport container has at least one sensor of the sensor module, which preferably detects a parameter from an interior of the wafer transport container. In particular, the wafer transport container is implemented to differ from a "Front Opening Unified Pod", a "Front Opening Universal Pod" (FOUP) and/or a "Standard Mechanical Interface Pod" (SMIF pod). In particular, the wafer transport container has a loading and/or unloading opening for loading and/or unloading of wafers into/out of the wafer transport container, which loading and/or unloading opening can in particular be closed in vacuum-type fashion by means of a wafer transport container opening element of the wafer transport container. In a correct transport position, the loading and/or unloading opening is arranged on an underside of the wafer transport container.

An "loading and/or unloading station" is in particular to mean a lock which is configured for transferring wafers between the wafer transport container and a further subcomponent of the wafer transfer system, for example a wafer processing module. In particular, the transfer of wafers by means of the loading and/or unloading station is performed in a particularly protected atmosphere, by means of which it is advantageously possible for contamination of or damage to the sensitive wafers to be prevented as far as possible. In particular, the wafer transport container and the loading and/or unloading station are configured for forming a common mini-environment, in particular in a coupled state in which the wafer transport container is fixed on a surface of the loading and/or unloading station in the loading and/or unloading position. An "mini-environment" is in particular to mean a housing with an atmosphere isolated from an ambient atmosphere, for example a vacuum. For a transfer of the at least one wafer out of the wafer transport container, during an unloading of the wafers, the wafer transport container opening element is lowered into an interior of the loading and/or unloading station.

A "wafer transport container transport system" is in particular to mean a system for transporting wafer transport containers which has transport carriages which are propelled for example on rails of a rail system within the fab and which are configured for holding wafer transport containers. The wafer transport container transport system is implemented in particular as an Overhead Hoist Transport System (OHT), which is suitable for use in clean rooms. Alternatively or in addition, the wafer transport container transport system may comprise further transport methods, for example, in particular autonomously acting, transport drones, carriages with wheels, conveyor belts, (vacuumized) transport tubes or the like.

A "registering of sensor data" is to be understood in particular also to mean a reading, acquisition and/or receipt of the sensor data of the sensor module, an activation and/or deactivation of a sensor of the sensor module and/or a storage of sensor data. A "processing of sensor data" is to be understood in particular also to mean a receipt, conversion and/or preparation of sensor data and preferably a transmission of the sensor data, for example to the central computer of the data processing unit, to the central control and/or regulation system of the fab and/or to at least one individual computer of the data processing unit and/or to other sensors of the sensor module. "Configured" is in particular to mean specifically programmed, designed and/or equipped. The statement that an object is configured for a particular function is in particular to mean that the object carries out and/or performs this particular function in at least one usage and/or operating state.

It is also proposed that the data processing unit has at least one prediction module, which is configured at least for generating, on the basis at least of sensor data of the sensor, in particular of at least one course of sensor data of the sensor, and/or on the basis of at least one parameter value determined with the aid of the sensor, a prediction for a future result and/or for a future event, in particular a future readiness for use at least of the partial component of the wafer transfer system. In this way, it is advantageously possible for a high level of process reliability to be achieved, in particular by virtue of the fact that future developments of important parameters, for example process parameters, safety parameters and/or quality parameters, can be reliably estimated. It is furthermore advantageously possible for time sequences in a chip production process to be optimized, whereby it is advantageously possible to achieve low process costs and/or high product quality.

It is furthermore advantageously possible for a failure and/or a malfunction of a sub-component of the wafer transport system to be detected preferably before an occurrence of damage, or predicted. In this way, it is advantageously possible for failure times to be kept short and for maintenance intervals to be optimized. Furthermore, it is possible in this way to achieve a long service life of the sub-component of the wafer transfer system. The prediction module may advantageously be implemented as a separate server and/or computer, in particular individual computer, within the data processing unit. Alternatively, the reduction module may advantageously be integrated in a server and/or computer of the data processing unit, for example the central computer of the data processing unit and/or the central control and/or regulation system of the fab. A "parameter value" takes the form in particular of an individual value of a parameter and/or a change of a parameter, for example an increase and/or a decrease of a parameter. The "chip production process" is in particular to mean the entire production process of a chip from a pure wafer substrate to a fully singularized chip.

A "prediction" is in particular to mean a parameter value, a course of a parameter and/or a parameter range. The prediction is preferably to be understood to mean an outputting of a machine-readable statement, and/or a statement which is clearly understandable to an operator, regarding a future course, for example an indication of a calculated period of time that is still available at a particular point in time and/or a calculated unit quantity that can still be processed at a particular point in time before an occurrence of an event, for example a malfunction and/or an overshooting/undershooting of a threshold value of a parameter. An "event" is in particular to mean an attainment and/or an overshooting and/or undershooting of a threshold value. Alternatively or in addition, an event may for example take the form of an exhaustion of a raw material, required for the processing, in a raw material tank, and/or an attainment of a fully filled state of a transport medium and/or a completion of a production step (for example complete outgassing/cooling etc.). The prediction is particularly preferably to be understood to mean an outputting of a machine-readable statement, and/or a statement which is clearly understandable to an operator, regarding an attainable event, for example an, in particular predicted, quality of a wafer, a period of time until a completion of the wafer, expected process costs, expected service lives of sub-components of the wafer transport system and/or expected readinesses for use of sub-components of the wafer transfer system. An "event" is in particular to mean a process parameter, such as for example a readiness for use, process costs, a process duration, a process speed etc., and/or a product parameter, such as for example a product quality.

It is furthermore proposed that the data processing unit has at least one prediction module which is configured at least for generating, on the basis of at least one course of sensor data at least of the sensor, a prediction for a future course of the sensor data. In this way, it is advantageously possible to achieve a high level of process reliability and/or a high level of process quality, in particular by virtue of the fact that a future further course of important parameters, for example process parameters, safety parameters and/or quality parameters, can be reliably estimated. A "course of sensor data" is in particular to mean a chronological sequence of parameter values of a parameter determined by means of a sensor of the sensor module and/or of a parameter processed by means of the data processing unit. In particular, the prediction module is configured for calculating the future course of the sensor data, for example by means of a mathematical extrapolation. It is conceivable that, in addition to the extrapolated future course, the prediction module determines and/or outputs at least one fault estimation and/or at least one uncertainty range of the calculated future course. For example, the prediction module detects an increase of a parameter, determines a mathematical function matching the increase, for example a linear function, and extrapolates a corresponding further, in this example linear, increase, on the basis of which the prediction module can predict a point in time at which the parameter overshoots a set threshold value if the predicted course is accurate.

It is furthermore proposed that the prediction module be configured at least for generating a prediction for a future event, for a future result, in particular for a future development of a readiness for use at least of the sub-component of the wafer transfer system, and/or for a future course of at least one sensor dataset, on the basis of a combination and/or on the basis of a comparison, in particular simultaneous comparison, of sensor data from at least two, in particular more than two, sensors. In this way, it is advantageously possible to generate a particularly reliable prediction. In particular, for the prediction, the prediction module takes into consideration at least two different parameters which have been determined by sensors with different measuring methods and/or different measuring tasks. In particular, the prediction module compares and/or combines the different parameters to generate the prediction. And "simultaneous comparison" is in particular to mean a comparison of parameters measured at the same time. For example, the prediction module assigns a simultaneous increase of the humidity and of the pressure in the wafer transport container to an impending leak of the wafer transport container, whereas an increase of the pressure without an increase in humidity is rather assigned to a balancing outgassing of a wafer which is still warm. Alternatively or in addition, it is conceivable that, for the prediction, the prediction module takes into consideration at least two identical parameters which have been determined by sensors with different measuring methods and/or identical measuring methods. A high level of redundancy can advantageously be achieved in this way.

It is furthermore proposed that the prediction module generates, from the determined future courses of the sensor data, at least one prediction for at least one period of time passing before an occurrence of a deviation of the sensor data from a safe data range. In this way, it is advantageously possible for an organizability of wafer transport processes and/or wafer production processes to be improved and/or facilitated. Sensor data which "deviate from a safe data range" and/or "lie outside a safe data range" are to be understood in particular to mean sensor data, preferably parameter values, which reach or undershoot or overshoot at least one predefined threshold value and/or which lie outside and admissible parameter range. It is conceivable that the data processing unit is configured for indicating the at least one period of time by means of a display unit.

It is furthermore proposed that the prediction module is configured for performing pattern recognition on the basis of at least one sensor dataset, in particular at least on the basis of a plurality of sensor datasets, in order to generate at least the prediction. A particularly effective and/or particularly accurate prediction can advantageously be made possible in this way. For example, from a regular abrupt increase and a subsequent likewise abrupt decrease of a pressure in an interior of the wafer transport container, the addiction module may infer a virtual vacuum leak, which can influence, in particular impair, a quality of the wafers in the wafer transport container. "Pattern recognition" is in particular to mean computer-aided pattern recognition, for example by means of clustering algorithms and/or classification algorithms. In particular, the prediction module has the capability to identify uniformities, repetitions, similarities and/or regularities in a set of sensor data.

If the wafer transfer unit has a control and/or regulation unit, which is configured at least for initiating, on the basis of the prediction of the prediction module, at least one adaptation of at least one parameter of at least one subcomponent of the wafer transfer system, it is advantageously possible for an event and/or an event with negative consequences to be counteracted. In this way, it is advantageously possible for a level of product quality and/or a level of production effectiveness to be increased. Furthermore, production costs and failure times can advantageously be kept low and short respectively. An "control and/or regulation unit" is in particular to mean a unit with at least one set of control electronics. A "set of control electronics" is in particular to mean a unit with a processor unit and with a memory module and with an operating program stored in the memory module.

The control and/or regulation unit is preferably embodied at least partially integrally with the central control and/or regulation system of the fab and/or with the data processing unit, in particular at least one individual computer of the data processing unit. In particular, the prediction module is configured for transmitting predictions to the central computer and/or to the central control and/or regulation system of the fab. In particular, the control and/or regulation unit is configured for, in particular automatically, reading predictions of the prediction module and, if necessary, deriving control impulses, for example for a controlling of the wafer transport container transport system, from the predictions. An "adaptation of at least one parameter" is in particular to mean an active adaptation of the parameter, for example an active reduction of an inner pressure of a wafer transport container. For example, upon receiving a prediction which predicts an impending overshooting of a maximum pressure in the wafer transport container, the control and/or regulation unit initiates a pressure reduction, for example by means of an activation of an embedded vacuum pump of the wafer transport container and/or by means of a diversion of the wafer transport container by means of the wafer transport container transport system to an external pump station which is configured for coupling to the wafer transport containers and regulating the inner pressure of wafer transport containers. A further example is a presetting of at least one parameter, for example of an inner pressure, of a pump pattern and/or of a temperature of components which make contact with wafers, of the loading and/or unloading station and/or of the wafer processing module prior to a delivery of a particular wafer transport container on the basis of transmitted predictions associated with the particular wafer transport container.

It is furthermore proposed that the wafer transfer unit has at least one control and/or regulation unit which is configured at least for a control and/or regulation of the logistics of at least one wafer transport container by means of a wafer transport container transport system at least on the basis of sensor data. In this way, logistics can advantageously be achieved which exhibit high efficiency and effectiveness. "Logistics" is to be understood to mean in particular planning, controlling, optimization and/or execution of goods transport, in particular of transport of wafer transport containers within the fab. In particular, controlling of the logistics of wafer transport containers comprises at least controlling of a distribution, of an assignment and/or of a transportation of wafer transport containers relative to wafer processing and/or wafer storage installations of the fab. For example, the control and/or regulation unit may be configured for delivering wafer transport containers to the individual processing steps in a manner graded in accordance with sensor data. Here, it would for example be possible for the wafer transport containers with the currently poorest sensor data to be delivered preferentially, whereby production of waste can advantageously be reduced. It would alternatively be possible, for example, for wafer transport containers with the presently best sensor data to be delivered preferentially, whereby it is advantageously possible for production batches of particularly high quality to be sorted out.

It is additionally proposed that a controlling of the logistics of the wafer transport container via the wafer transport container transport system is performed by means of the control and/or regulation unit on the basis of the prediction generated by the prediction module. In this way, it is advantageously possible for an event and/or an event with negative consequences to be counteracted. In this way, it is advantageously possible for a level of product quality and/or a level of production effectiveness to be increased. Furthermore, production costs and failure times can advantageously be kept low and short respectively. For example, the control and/or regulation unit may be configured for delivering wafer transport containers to the individual processing steps in a manner graded in accordance with their predictions. Here, it would for example be possible for wafer transport containers with particularly negative predictions, or particularly short periods of time until an occurrence of an event, to be delivered preferentially, whereby it is advantageously possible for production of waste to be reduced. Alternatively, it would for example be possible for wafer transport containers with particularly positive predictions, or particularly good parameter values, for example particularly low humidity, to be delivered preferentially, whereby it is advantageously possible for production batches of particularly high quality to be sorted out.

If the control and/or regulation unit is configured for preventing a deviation of at least one parameter of the wafer transport container from a safe data range, in particular by means of the wafer transport container transport system, production of waste can advantageously be kept low, and/or contamination of sub-components of the wafer transfer system can be avoided by removal of contaminated wafer transport containers from a production circuit. In particular, the control and/or regulation unit is configured for diverting, by means of the wafer transport container transport system, wafer transport containers whose sensors output sensor data which deviate from the safe data range, and/or which have, by the prediction module, been assigned a prediction which predicts an impending deviation from the safe data range, in order for said wafer transport containers to be regenerated and/or sorted out. In particular, the wafer transfer system comprises a regeneration station which is configured for regenerating at least one parameter of the wafer transport container, for example an inner pressure and/or a level of contamination. For example, it would be possible for the regeneration station to comprise a pumped evacuation station for pumped evacuation of wafer transport containers and/or a plasma regeneration station for regenerating inner walls of wafer transport containers. Alternatively or in addition, it would be possible for the regeneration station to comprise a reloading station which is configured for reloading wafers from a faulty wafer transport container, and/or a wafer transport container that is to be regenerated, into a freshly conditioned, fault-free wafer transport container.

It is furthermore proposed that at least the data processing unit, at least the prediction module, in particular a prediction method of the prediction module, and/or at least the control and/or regulation unit, in particular a reaction of the control and/or regulation unit to a prediction of the prediction module, are/is of post- and/or re-programmable design. A high level of flexibility can advantageously be achieved in this way. In particular, the operating program of the data processing unit, of the prediction module and/or of the control and/or regulation unit may be specially configured such that easy and flexible post- and/or re-programming of rules which define reactions of the wafer transfer system to the output of the prediction module is possible. In particular, the data processing unit, the prediction module and/or the control and/or regulation unit has a user interface which comprises at least one input unit, for example a keyboard, and one output unit, for example a screen, and which is specially programmed to permit a display, modification and/or combination of existing rules and an inputting of new rules.

Is furthermore proposed that the wafer transfer unit has a machine learning module, which is configured for optimizing a prediction by machine learning and/or for optimizing a reaction to a prediction by machine learning. In this way, it is as advantageously possible for a continuous improvement of the wafer transfer unit to be made possible. Furthermore, it is advantageously possible for an, in particular at least partial, adaptation of the wafer transfer unit to a particular fab to be made possible. The machine learning module may advantageously be implemented as a separate server and/or computer, in particular individual computer, within the data processing unit. Alternatively, the machine learning module may advantageously be integrated in a server and/or computer of the data processing unit, for example the central computer of the data processing unit and/or the central control and/or regulation unit of the fab. In particular, the machine learning module is embodied at least partially integrally with the prediction module. In particular, the machine learning module is configured for, in particular automatically, detecting new patterns in sensor datasets and preferably making these available for the pattern recognition by the prediction module. In particular, the machine learning module is configured for monitored learning, wherein, preferably, patterns detected by the machine learning module must be checked and approved by an operator. Approved patterns, after being approved by the operator, may, by means of post-programming of the data processing unit, of the prediction module and/or of the control and/or regulation unit, be allocated at least one new and/or at least one existing rule. Alternatively or in addition, the machine learning module may be configured for at least partially monitored learning and/or unmonitored learning. In particular, the machine learning module is configured for trawling through sensor datasets stored in the run-up to a malfunction/malfunctions of at least one sub-component of the wafer transfer system in order to i a pattern/patterns which could have potentially led to the malfunction(s). In this way, it is advantageously for hitherto unknown fault sources and/or fault indicators to be identified, and the determined pattern may possibly be used to determine a strategy for future counteraction.

It is furthermore proposed that the wafer transfer unit comprises the sensor module, which has at least one sensor. Monitoring of the wafers and/or of the environmental conditions of the wafers can advantageously be made possible in this way, whereby it is possible in particular for faults, in particular production faults, damage to wafers and/or contamination of wafers, to be prevented. In particular, at least one sensor module, preferably at least one sensor, is assigned to an individual sub-component of the wafer transfer system. In particular, at least one sensor module, preferably at least one sensor, is fixedly connected to at least one individual sub-component of the wafer transfer system. In particular, the wafer transfer unit comprises a plurality of sensor modules which may comprise in particular a plurality of centers. In particular, at least one sensor of the sensor module is implemented as an optical sensor, as an electronic, in particular resistive and/or capacitive sensor, as a magnetic sensor, as a mechanical sensor, as a thermoelectric sensor, as a piezoelectric sensor and/or as an inductive sensor. The sensor is preferably implemented so as to be at least partially integrated into a sub-component of the wafer transfer system; for example, the sensor is arranged on an inner wall of a wafer transport container.

It is furthermore proposed that the sensor module has at least one further sensor which is implemented at least substantially identically to the sensor. In this way, a level of redundancy can advantageously be increased, whereby, in particular, malfunctions of individual sensors can be easily and/or quickly identified. In particular, the further sensor of the sensor module is configured for detecting the same parameters of the same sub-component of the wafer transfer system as the sensor of the sensor module.

It is furthermore proposed that the sensor of the sensor module is configured for determining a parameter, the sensor module having at least one additional further sensor, which is configured for determining the same parameter as the sensor, the additional further sensor using, for determining the parameter, a measuring method which at least substantially differs from a measuring method by which the sensor determines the parameter. In this way, a level of redundancy can advantageously be further increased, whereby it is possible in particular for malfunctions of individual sensors to be identified easily and/or quickly, and for plausibilities of measured values to be made easily and quickly checkable. In particular, the additional further sensor of the sensor module is configured for detecting the same parameter of the same sub-component of the wafer transfer system as the sensor of the sensor module and/or the further sensor of the sensor module.

It is furthermore proposed that the wafer transfer unit has at least one measuring technology unit, which comprises at least the sensor, in particular at least the sensors, of the sensor module and/or at least a portion of the data processing unit, in particular at least one individual computer of the data processing unit, and implements an assembly group, which is in particular realized as a common package, the measuring technology unit being configured for exchangeable arrangement on at least one sub-component of the wafer transfer system, in particular on the wafer transport container, the wafer processing module and/or the loading and/or unloading station. In this way, a level of flexibility can advantageously be increased, in particular by virtue of the fact that the measuring technology unit is implemented to be reusable and/or exchangeable. It is advantageously possible for a composition of the measuring technology unit to be adapted to particular boundary conditions, for example to a particular sensor configuration and/or to a particular sensor composition. Furthermore, the measuring technology unit may advantageously be dismounted from decommissioned sub-components, sub-components which are to be regenerated, and/or presently unused sub-components of the wafer transfer system, in particular wafer transport containers, and mounted on new, regenerated and/or presently used sub-components of the wafer transfer system, in particular wafer transport containers. In this way, it is advantageously possible for replacement part costs to be kept low. In particular, the measuring technology unit is configured for capturing sensor data by means of the sensor and processing the detected sensor data by means of the data processing unit. The measuring technology unit is preferably implemented as a sensor measuring appliance which is implemented to be non-destructively mountable on a further component and/or removable from a sub-component of the wafer transfer system, in particular a wafer transport container.

The statement that multiple components "form an assembly" is in this context to be understood in particular to mean that the components have at least one common housing and/or that the components are implemented such that they cannot be separated from one another without the use of tools and/or cannot be non-destructively separated from one another. The statement that the measuring technology unit is configured for an "exchangeable arrangement" is in particular to mean that the measuring technology unit as a whole is configured to be non-destructively mountable to a further component and/or removable from a further component. The measuring technology unit is preferably implemented to be mountable on a further component and/or removable from a further component without the use of tools.

In particular, the measuring technology unit has an assembly element which is advantageously configured for coupling to a corresponding assembly element of a further component, for example of the wafer transport container. In particular, the assembly element and the corresponding assembly element are realized as positive-locking elements which are configured in particular for coupling to one another at least by means of positive locking, in particular engaging into one another, for example by means of a clip-type connection with at least one latch lug. Alternatively or in addition, the assembly element may also comprise a non-positive locking connection, for example a screw connection and/or a connection which can be produced and/or released by means of a tool. It is furthermore conceivable for the measuring technology unit to comprise, in particular instead of a sensor integrated into the measuring technology unit, at least one connector element, in particular plug connector, for connection of at least one data output of a sensor. For example, the sensor is fixedly integrated in the sub-component of the wafer transfer system, in particular in the wafer transport container, and has a data output which is implemented in particular as a plug connector and which is preferably accessible from the outside. Here, when the measuring technology unit is coupled to the sub-component of the wafer transfer system, a data connection is preferably produced between the data processing unit and the sensor. It is alternatively or additionally conceivable for the sensor to be configured for wireless communication of the sensor data. In particular, the sensor has a transmitter module for wireless communication of the sensor data. In particular, the measuring technology unit has a receiver module for wireless communication of the sensor data. The transmitter module of the sensor and the receiver module of the measuring technology unit preferably communicate by means of near-field communication (NFC) technology. In this way, it is advantageously possible for a separate energy supply, for example a battery, of the sensor module to be omitted.

It is furthermore proposed that the wafer transfer unit has a quick-coupling device, which is configured for releasable and/or exchangeable coupling of the measuring technology unit to a sub-component of the wafer transfer system, in particular to the wafer transport container and/or to the loading and/or unloading station. In this way, a simple and/or quick exchange, mounting and/or demounting of the measuring technology unit can advantageously be made possible. Furthermore, in this way, a level of working effort during mounting and/or demounting is advantageously reducible, thus in particular increasing operating convenience. The quick-coupling device comprises, in particular, the clip-type connection, or a latch connection, which is preferably configured for producing a positive locking. Alternatively or in addition, the quick-coupling device may comprise a magnetic connection, for example with at least one permanent magnet, which is preferably configured for producing non-positive locking, in particular magnetic non-positive locking. The magnetic connection preferably comprises a plurality of magnet elements, in particular magnets, which are arranged preferably at least substantially in one plane. By means of such an arrangement, it is advantageously possible for an orientation of the measuring technology unit relative to the sub-component of the wafer transfer system, in particular relative to the wafer transport container, to be defined, and/or for slippage/rotation to be avoided. In particular, the quick-coupling device is implemented such that it can be produced and/or released non-destructively and/or without the use of tools.

If at least one sensor is configured for, in particular optically, capturing at least a portion of an outer shape, in particular a degree of a deformation, of at least one wafer, which is in particular arranged in the sub-component of the wafer transfer system, a quality check of the wafers can advantageously be performed already during an execution of the chip production process. Furthermore, it is thus advantageously possible for a course of a state of the outer shape to be monitored during the execution of the entire chip production process, in particular between individual processing steps, whereby it is possible in particular for sources that have an influence on the outer shape of the wafers to be identified. It is thus advantageously possible to realize a high level of process reliability and a high level of quality. A "degree of deformation" is in particular to mean a deviation of the shape of a wafer from an ideally circular and/or ideally flat outer shape, for example an at least partial bulge, in particular in a wafer plane. The acquisition of the outer shape is performed in particular by means of an optical sensor, for example by means of a camera, by means of a light barrier and/or by means of a laser sensor. For example, the acquisition of the outer shape of the wafers, in particular of a deformation of the wafers, may be performed by means of the camera using automated image recognition. For example, the acquisition of the outer shape of the wafers, in particular of the deformation of the wafers, is performed by means of the light barrier or by means of the light sensor by evaluation of transmitted and/or reflected radiated light. Alternatively or in addition, the outer shape of the wafers may be detected for example by means of a capacitive measuring method and/or by means of scanning.

It is furthermore proposed that the detected outer shape forms an actual outer shape of the wafer, the data processing unit being configured for comparing the actual outer shape of the wafer at least with a nominal outer shape of the wafer. In this way, automatic quality monitoring and/or automatic fault monitoring can advantageously be made possible. In particular, the nominal outer shape is stored in the memory module of the data processing unit. In particular, for a check of the outer shape, in particular for a determination of the deviation of the outer shape of a wafer, the data processing unit virtually superimposes the measured actual outer shape with the stored nominal outer shape. In particular, the data processing unit is configured to output a notification to an operator and/or output an instruction to the central control and/or regulation system of the fab, which leads to corresponding labelling and/or sorting-out of the wafer, if the determined deviation of the outer shape of the wafer overshoots a particular, in particular manually settable, threshold value.

It is furthermore proposed that at least one sensor is configured for detecting at least a position of at least one wafer, in particular at least one positioning of at least one wafer, within the sub-component of the wafer transfer system, in particular within a wafer holding device of the wafer transfer unit, preferably a wafer rack of the wafer transfer unit. In this way, it is advantageously possible for in particular automated monitoring of the position of the wafers to be made possible, whereby a level of process reliability can advantageously be increased. In particular, the positioning takes the form of a centering of the wafer in the intended position within the sub-component of the wafer transfer system. The sensor is preferably configured for monitoring a centering accuracy of the wafer.

It is furthermore proposed that the detected position, in particular positioning, implements an actual position, in particular actual positioning, of the wafer, the data processing unit being configured for comparing the actual position, in particular actual positioning, of the wafer at least with a nominal position, in particular nominal positioning, of the wafer. In this way, it is advantageously possible for automatic quality monitoring and/or automatic fault monitoring to be made possible. In particular, the nominal position, in particular nominal positioning, is stored in the memory module of the data processing unit. In particular, for a check of the position, in particular positioning, in particular for a determination of the deviation of the position, in particular positioning, of a wafer, the data processing unit virtually superimposes the measured actual position, in particular actual positioning, with the stored nominal position, in particular nominal positioning. In particular, the data processing unit is configured for outputting a notification to an operator and/or an instruction to the central control and/or regulation system of the fab, which leads to corresponding labelling and/or sorting-out of the wafer, if the determined deviation of the position, in particular positioning, of the wafer overshoots a particular, in particular manually settable, threshold value.

If at least one sensor of the sensor module is implemented as a passive sensor, an inexpensive and/or easily identifiable or readable detecting method can advantageously be made possible. A "passive sensor" is in particular to mean a sensor which is functional independently of an electrical energy supply. The passive sensor is preferably implemented as a color indicator, in particular a reversible color indicator. For example, the passive sensor changes color in the event of an increase of a monitored parameter, for example of a humidity and/or of an oxygen concentration. A change in color can in particular be read directly by an operator or by means of image processing of a camera. It is conceivable for the monitored sub-component of the wafer transfer system, in particular the wafer transport container, to have a transparent element, for example a viewing window, which preferably enables the passive sensor to be viewed, wherein the passive sensor is arranged in particular in an interior of the sub-component of the wafer transfer system, in particular of the wafer transport container. Alternatively or in addition, the passive sensor may for example comprise at least one strain gauge and/or at least one mechanical thermometer, such as a bimetal thermometer or a liquid thermometer.

It is furthermore proposed that at least one sensor of the sensor module is configured for detecting at least one parameter of the wafer transport container, in particular of an interior of the wafer transport container. In this way, a high level of process reliability can advantageously be achieved, in particular by virtue of the fact that wafers can be monitored during transportation and/or storage between individual process steps. In this way, it is advantageously possible for a risk of contamination of and/or damage to a wafer processing module owing to contaminated and/or faulty wafers to be lowered. At least one of the detected parameters of the wafer transport container, in particular of the interior of the wafer transport container, preferably takes the form of at least one of the above-mentioned physical, chemical and/or geometrical parameters, for example an inner pressure of the wafer transport container, an oxygen concentration and/or a humidity.

If at least one sensor of the sensor module is configured for detecting at least one parameter of a content of a wafer transport container, in particular of an object stored in the wafer transport container, preferably of a wafer stored in the wafer transport container, a high level of process reliability can advantageously be achieved, in particular by virtue of the fact that wafers can be monitored during transportation and/or storage between individual process steps. In this way, it is advantageously possible for a risk of contamination of and/or damage to a wafer processing module owing to contaminated and/or faulty wafers to be lowered. At least one of the detected parameters of the content of the wafer transport container, in particular of the object stored in the wafer transport container, preferably of the wafer stored in the wafer transport container, is preferentially realized as at least one of the above-mentioned physical, chemical and/or geometrical parameters, for example a temperature of the object, a bulge of the object and/or a positioning of the object. The object stored in the wafer transport container takes the form in particular of a wafer, an exposure mask for wafers or a similar object required for chip production.

It is furthermore proposed that at least one sensor of the sensor module is assignable to at least one sub-group of objects, in particular wafers, stored in the wafer transport container, in particular to exactly one object stored in the wafer transport container, in particular exactly one wafer stored in the wafer transport container. Separate monitoring of individual sub-groups of objects, in particular wafers, preferably of individual objects, in particular wafers, and/or of a plurality of objects, in particular wafers, can advantageously be made possible in this way. A high level of monitoring accuracy can advantageously be made possible in this way. A "sub-group of objects" is in particular to mean a group of objects which comprises at most 90% of all objects, preferably at most 50% of all objects, advantageously at most 30% of all objects, preferably at most 10% of all objects, and particularly preferably exactly one object. In particular, the entirety of all objects, if the entirety of all objects exceeds the value of one, comprises at least two sub-groups and at most a number of sub-groups corresponding to the number of objects. The sensor assigned to one sub-group of objects, in particular to an individual object, is in particular configured for capturing only sensor data associated with the objects of the sub-group, in particular with the individual object. Preferably, each sub-group of objects, in particular each object, is assigned at least one sensor. For example, each sub-group of objects, in particular each object, is assigned a temperature sensor. In this way, it is advantageously possible for variations of parameters, for example temperature variations arising owing to cooling processes taking place at different rates, within the wafer transport container to be captured. It is advantageously possible for individual faulty objects to be better identified and, if necessary, sorted out.

It is furthermore proposed that at least one sensor of the sensor module is configured for detecting at least one parameter of the loading and/or unloading station, in particular of an interior of the loading and/or unloading station. A high level of process reliability can advantageously be achieved in this way, in particular by virtue of the fact that wafers can be monitored during a transfer between individual wafer transport containers and/or between a wafer transport container and a wafer processing module. In this way, it is advantageously possible for a risk of contamination of and/or damage to a wafer transport container and/or a wafer processing module owing to contaminated and/or faulty wafers to be lowered. At least one of the detected parameters of the loading and/or unloading station, in particular of the interior of the loading and/or unloading station, preferably takes the form of at least one of the above-mentioned physical, chemical and/or geometrical parameters, for example an inner pressure of the loading and/or unloading station, an oxygen concentration and/or a humidity.

It is furthermore proposed that at least one sensor of the sensor module is configured for detecting at least one parameter of the wafer processing module, of the wafer transport container transport system and/or of the wafer handling robot. A high level of process reliability can advantageously be achieved in this way, in particular by virtue of the fact wafers can be monitored during processing or during transport between individual wafer processing modules. In this way, it is advantageously possible for a risk of contamination of and/or damage to the wafer processing module owing to contaminated and/or faulty wafers to be lowered. At least one of the detected parameters of the wafer processing module, of the wafer transport container transport system and/or of the wafer handling robot, preferably takes the form of at least one of the above-mentioned physical, chemical and/or geometrical parameters, for example an acceleration and/or a jerk.

It is furthermore proposed that at least one sensor of the sensor module is configured for detecting a parameter of a local environment, which is implemented by an interior of the wafer transport container and an interior of the loading and/or unloading station during a wafer transfer process. In this way, a high level of process reliability can advantageously be achieved, in particular by virtue of the fact that wafers can be monitored during a transfer between individual wafer transport containers and/or between a wafer transport container and a wafer processing module. In this way, it is advantageously possible for a risk of contamination of and/or damage to a wafer transport container and/or a wafer processing module owing to contaminated and/or faulty wafers to be lowered. Furthermore, it is advantageously possible for a sensor of the loading and/or unloading station to be used for determining a parameter of the wafer transport container, for example the inner pressure of the wafer transport container, or vice versa. At least one of the detected parameters of the local environment, in particular of the mini-environment formed during the wafer transfer process, preferably takes the form of at least one of the above-mentioned physical, chemical and/or geometrical parameters, for example an inner pressure of the mini-environment, an oxygen concentration and/or a humidity. The "wafer transfer process" comprises in particular a process in which wafers are unloaded from the wafer transport container by lowering of the wafer transport container opening element into the interior of the loading and/or unloading station and are transferred into the wafer processing module by means of the wafer handling robot. In particular, the local environment forms the mini-environment.

If the data processing unit and/or the sensor module has at least one memory module, in particular the above-mentioned memory module, which is configured at least for storing a course of sensor data, precise tracing of fault sources can advantageously be made possible. In particular, the sensor module is configured for periodically storing sensor data in the memory module. In particular, the sensor module and the data processing unit have memory modules implemented separately from one another. The memory module of the sensor module is preferably read by the data processing unit at regular intervals, and the stored courses of sensor data are transferred from the memory module of the sensor module into the memory module of the data processing unit, in particular for evaluation. The memory module of the data processing unit preferably has a much greater storage capacity than the memory module of the sensor module.

It is furthermore proposed that the data processing unit has at least one evaluation module, which is configured at least for an evaluation of at least one course of sensor data, which is stored in particular in the memory module of the data processing unit, the evaluation module comprising an automatic fault detection means which is configured at least for detecting at least a malfunction of a sensor of the sensor module and/or abnormal sensor data of at least one sensor of the sensor module. In this way, it is advantageously possible for malfunctions and/or erroneous control operations by the control and/or regulation system of the fab on the basis of erroneous data to be prevented. The evaluation module may advantageously be implemented as a separate server and/or computer, in particular individual computer, within the data processing unit. Alternatively, the evaluation module may advantageously be integrated in a server and/or computer of the data processing unit, for example the central computer of the data processing unit and/or the central control and/or regulation system of the fab. "Abnormal sensor data" are in particular sensor data which have an abnormal course, for example intense noise and/or particularly abrupt step changes, and/or abnormal parameter values, for example parameter values lying outside a physically realistic range. The automatic fault detection means is in particular implemented to be post- and/or reprogrammable. Rules on the basis of which the automatic fault detection means detects a malfunction and/or abnormal sensor data can preferably be manually supplemented, deleted and/or modified.

If at least one sensor is embodied as a camera system, in particular an intelligent camera system, a determination of at least one parameter and/or of a parameter value by means of image recognition can advantageously be made possible. It is advantageously possible for a camera system to be configured for capturing more than one individual parameter, in particular simultaneously or sequentially. The camera system, in particular a camera of the camera system, is preferably configured for capturing two different parameters, in particular geometry parameters such as a bulge of a wafer, a positioning of a wafer and/or a diameter of a wafer. The camera system, in particular the camera of the camera system, is preferably configured for capturing more than two different parameters. An "intelligent camera system" is in particular to mean a camera system which communicates with the data processing unit and which preferably performs automatic focusing and/or orientation of the camera in a manner dependent on the parameter to be captured, and which in particular comprises an automatic image processing means for automatic extraction of parameters from images recorded by means of the camera system. For example, the camera system comprises an automatic wafer recognition means which is in particular configured for automatically identifying wafers that are situated in an image field of the camera system. The camera system is preferably configured at least for automatically reading at least one passive sensor of the sensor module.

It is furthermore proposed that the wafer transfer unit has at least one wafer holding device, in particular a wafer rack, on and/or in which at least one sensor of the sensor module is arranged. In this way, an acquisition of a parameter by means of a sensor which is situated in a proximity of a wafer can advantageously be made possible, whereby it is possible in particular for a high level of precision to be attained. Furthermore, it is advantageously possible in this way for a captured parameter to be assigned to a single wafer within a plurality of wafers, whereby it is possible in particular for differences of parameters, for example temperature differences, of different wafers to be captured. The "wafer holding device" is implemented in particular as a device which is configured for retaining at least one wafer, preferably a plurality of wafers, in a fixed position. The wafer holding device is preferably arranged in the interior of the wafer transport container. The wafer holding device is preferably connected fixedly to the wafer transport container opening element. In particular during a formation of the mini-environment, the wafer holding device moves together with the wafer transport container opening element into the interior of the loading and/or unloading station. The wafer holding device is in particular implemented of a vacuum-compatible material, for example a metal, a machinable glass ceramic and/or a plastic such as for example PEEK. The wafer holding device has, in particular, clamp elements which are configured for preventing slipping of the held wafers. The sensor is in particular at least partially integrated in the wafer holding device, in particular in at least one of the clamp elements of the wafer holding device, and is preferably embodied integrally with the wafer holding device, in particular with at least one of the clamp elements of the wafer holding device.

It is furthermore proposed that the wafer transfer unit has a charging module, which is configured for contactlessly supplying charging energy to an energy store of the sensor module and/or to an energy store of the data processing unit. In this way, a particular simple charging process can advantageously be made possible. The energy store is in particular implemented as a physical energy store, for example a capacitor or the like, and/or as a chemical energy store, for example a battery or the like. A "contactless supply of charging energy" is to be understood in particular as a supply of charging energy in the case of which, at least in certain portions, the energy for charging the energy store is transmitted entirely wirelessly. In particular, a transmission of energy by the charging module is performed by means of a magnetic field, for example by induction, by means of an electromagnetic wave and/or by means of light, for example by means of a photocell. The charging module comprises in particular at least one energy transmitter element which is for example implemented as a magnetic field generator, as a generator for generating electromagnetic radiation and/or as a light source for emitting light waves. The energy transmitter element is preferably arranged at least on one sub-component of the wafer transfer system, for example on the loading and/or unloading station. In particular, the wafer transfer system comprises a plurality of energy transmitter elements, which are arranged at different points of the wafer transfer system. Alternatively or in addition, at least one energy transmitter element may form a separate sub-component of the wafer transfer system which is independent of a further sub-component of the wafer transfer system. Furthermore, the charging module comprises in particular an energy receiver element which is embodied for example at least as a magnet coil, as an antenna for receiving electromagnetic radiation and/or as a photocell. The energy receiver element is in particular assigned to at least one sensor of the sensor module, preferably to a plurality of sensors of the sensor module, and/or to at least one individual computer of the data processing unit. The energy receiver element is arranged at least on one sub-component of the wafer transfer system, for example on a wafer transport container. Alternatively or in addition, it is conceivable that, during a docking process of the wafer transport container on the loading and/or unloading station, at least one energy receiver element of a wafer transport container produces a direct-contact plug connection with at least one energy transmitter element for the purposes of charging at least one energy store associated with the wafer transport container.

It is additionally proposed that the charging module has at least one conductive track, which is configured for extracting a charging energy from an electrical and/or magnetic field and converting it into electrical energy. Wireless energy transmission, in particular between components of the charging module, can advantageously be made possible in this way. By means of wireless energy transmission, in particular by omitting with wearing plug connections, a susceptibility to faults can advantageously be reduced. In particular, the conductive track is assigned to the energy receiver element. In particular, the conductive track is embodied as an RFID antenna and/or as an induction coil or the like.

It is furthermore proposed that the wafer transfer unit has at least one photocell unit, which is configured for supplying charging energy to an energy store of the sensor module and/or to an energy store of the data processing unit. In this way, the simple wireless charging facility can advantageously be created. In particular, the photocell unit at least partially forms an energy receiver element. In particular, the photocell unit has at least one photocell, preferably the above-mentioned photocell.

Is furthermore proposed that the wafer transfer unit has at least one illumination unit, which is configured for illuminating at least one photocell of the photocell unit. A simple wireless feed of energy to an energy receiver element can advantageously be realized in this way. In particular, the illumination unit forms an energy transmitter element. In particular, the illumination unit has a light source, in particular the above-mentioned light source.

It is furthermore proposed that the data processing unit, in particular at least one individual computer of the data processing unit, has, for a processing of sensor data, at least one NFC interface and/or WLAN interface. This advantageously allows a direct communication between at least temporarily adjacent parts of the data processing unit, in particular individual computers. For example, an individual computer of the data processing unit, which is assigned to a sensor for determining the inner pressure within the loading and/or unloading station, may be configured in such a way that, when a further individual computer of the data processing unit, which is assigned for example to a sensor for determining the inner pressure in the interior of a wafer transport container, moves into the proximity of the former individual computer, may automatically receive data of the further individual computer by way of the NFC interface, and may determine a differential pressure between the loading and/or unloading station and the wafer transport container from a combination of measured and received data. Alternatively or in addition, the data processing unit may, for a processing of sensor data, comprise a Bluetooth, ZigBee, WiMAX or similar interface for wireless data transfer, preferably near-field data transfer.

It is furthermore proposed that the wafer transfer unit comprises at least one reader device, which has at least one read point and which is configured for triggering data communication of the data processing unit, in particular of a data transfer element of the data processing unit, if the data processing unit, in particular the data transfer element, is positioned in a proximity of the read point. A high level of energy efficiency can advantageously be achieved in this way, in particular by virtue of the fact that energy-consuming data communication is active only when a receiver is definitely available within receiving range. In particular, the read point is assigned to at least one sub-component of the wafer transfer system, in particular at least to the wafer transport container transport system and/or to the loading and/or unloading station. In particular, the data communication comprises at least one transmission of sensor datasets, of identifiers of wafer transport containers, which are configured for uniquely identifying wafer transport containers, and/or of handling instructions, for example to the individual computers of the sensors, in particular for the purposes of an adaptation of sensor settings, measuring intervals or the like. The wafer transfer system preferably comprises a plurality of read points. In particular, the read points are arranged at junctions of the rail system of the fab which are preferably passed by all wafer transport containers during the chip production process. Furthermore, the read points are preferably assigned to loading and/or unloading stations at which wafer transport containers dock during the chip production process. The reader device is in particular embodied as an RFID read unit or the like.

Alternatively or in addition, a read point may form a separate sub-component of the wafer transfer system, which is preferably independent of further sub-components of the wafer transfer system. In particular, an independent read point of said type forms a diagnostics station. It is conceivable for all wafer transport containers to selectively move to a diagnostics station and/or a read point at least once during the course of a regular production cycle. It is alternatively or additionally conceivable for wafer transport containers to be selectively diverted to the diagnostics station and/or to a read point manually by an operator or automatically by the central control and/or regulation system of the fab, in particular in a manner dependent on a prediction, on a total storage time of the wafers stored in the wafer transport container and/or on a measured parameter value. It is furthermore conceivable that a frequency of a selective movement to the diagnostics station and/or to a read point varies in a manner dependent on a prediction. Here, in particular, a frequency decreases with increasing positivity of a prediction.

A "proximity" of an object, in particular of the read point, of the rail system and/or of the transport carriage is in particular to mean a region realized by points which are at a distance of at most 5 m, preferably at most 2 m, advantageously at most 1 m, preferably at most 50 cm and particularly preferably at most 25 cm from the object. The data transfer element comprises in particular at least one transmitting mechanism, which is configured for a transmission of electronic data of the data processing unit, in particular of an individual computer, and at least one receiving mechanism, which is configured for a receipt of electronic data of the data processing unit, in particular of an individual computer. In particular, during data communication, the data transfer element transmits all information items contained in the memory module of the data processing unit, in particular all information items contained in the memory modules of that part of the data processing unit which is situated in the proximity, preferably in the memory modules of the individual computers situated in the proximity, to the reader device. Alternatively or in addition, the reader device may be configured for interrogating only particular, selectable data items, for example a particular sensor dataset, of the data processing unit, whereupon the data processing unit transmits only the interrogated data. The statement that a data communication is "triggered" is in particular to mean that, upon a detection of a presence of at least a portion of the data processing unit, preferably of at least one individual computer, in the proximity, a data communication is automatically initiated.

If the charging module and/or a charging energy supply module of the wafer transfer unit, which is configured for contactlessly transmitting charging energy to at least a portion of the charging module, in particular the energy receiver element, during a charging process, is embodied at least partially integrally with the reader device, a reduction of components can advantageously be made possible, whereby it is possible in particular for production and material costs to be kept low.

It is additionally proposed that at least a portion of the data processing unit, in particular at least one individual computer of the data processing unit, is assigned to a wafer transport container of the wafer transfer system and is configured for exchanging sensor data, in particular pressure sensor data, of the wafer transport container with at least one further portion of the data processing unit, in particular at least one further individual computer of the data processing unit, which is assigned to the loading and/or unloading station of the wafer transfer system, in particular during a formation of the local environment for the wafer transfer process. In this way, it is advantageously possible for at least one parameter of the loading and/or unloading station, for example an inner pressure, to be aligned with a parameter of the wafer transport container. In this way, it is advantageously possible for parameters of the loading and/or unloading station and of the wafer transport container to be coordinated with one another for the formation of the mini-environment, preferably prior to information of the mini-environment. For example, the inner pressure of the wafer transport container is transmitted to the loading and/or unloading station, whereupon the inner pressure of the loading and/or unloading station is adapted to the received pressure value prior to an opening of the wafer transport container by means of the wafer transport container opening element.

It is furthermore proposed that the wafer transfer unit has at least one alarm module, which is configured at least for outputting at least one, in particular acoustic and/or visual, warning in the event of a detection of a deviation of sensor data of at least one sensor from the, in particular pre-settable, safe data range and/or in the event of a detection of a malfunction of at least one sub-component of the wafer transfer system. In this way, attention can be drawn to a possible malfunction in an advantageously quick and effective manner, whereby in particular an effective and quick reaction to the malfunction can be made possible. In this way, it is advantageously possible for failure times to be avoided and/or kept short in terms of time. The alarm module comprises in particular at least one siren, at least one warning lamp and/or at least one data-transmitting device, which is configured in particular for transmitting warnings and/or notifications regarding the detected deviation and/or malfunction to at least one operator and/or to at least the central control and/or regulation system of the fab. In particular, the alarm module is assigned to at least one sub-component of the wafer transfer system. The wafer transfer unit preferably comprises a plurality of alarm modules, which are in particular assigned to different sub-components of the wafer transfer system. It is preferable for at least one alarm module to be assigned to at least one, particularly preferably to each, wafer transport container. In particular, the alarm module is fixedly connected to the wafer transport container. It is advantageously possible by means of the alarm module for a wafer transport container with a malfunction to be quickly and easily identified in a large number of wafer transport containers, for example by means of a correspondingly clearly visible illumination, which has for example a conspicuous color, a strong light intensity and/or a brightness modulation, and/or by means of a correspondingly clearly audible acoustic signal.

In particular, the evaluation module is configured for, in the event of a detection of a fault by the automatic fault detection means, activating the alarm module, in particular the alarm module associated with that sub-component of the wafer transfer system which has the fault. The central control and/or regulation system of the fab is in particular configured for performing automatic control, which deactivates the affected sub-component of the wafer transfer system and/or removes it from the chip production process, in the event of a warning being received and/or detected. The central control and/or regulation system of the fab preferably instructs the wafer transport container transport system to divert a wafer transport container for which a warning is present to a diagnostics station, to divert said wafer transport container to a regeneration station and/or to remove said wafer transport container from the production cycle entirely. Alternatively or in addition, the central control and/or regulation system of the fab is configured to instruct the wafer transport container transport system to deliver no further wafers, in particular no wafer transport containers, to a sub-component of the wafer transport system, for example a loading and/or unloading station, for which a warning is present and/or which is connected to a wafer processing module for which a warning is present.

Furthermore, a wafer transport container with the wafer transfer unit and with at least one sensor module having at least one sensor is proposed. In this way, it is possible in particular to achieve advantageous characteristics with regard to a transportation of at least one wafer, a storage of at least one wafer and/or of a transfer of at least one wafer to a further sub-component of the wafer transfer system.

It is furthermore proposed that the wafer transport container has at least one tempering unit, which is configured at least for tempering, in particular heating and/or cooling, at least one object stored in the wafer transport container, in particular at least one wafer stored in the wafer transport container, on the basis of sensor data of the at least one sensor, the at least one sensor being implemented as a temperature sensor. In this way, it can advantageously be made possible for objects in the interior of the wafer transport container to be kept at a temperature which is advantageous for the objects and/or chip production process and/or to be brought to the advantageous temperature. The tempering unit comprises in particular a heating system and/or a cooling system. The tempering of an object by means of the tempering unit is performed in particular by means of a heat flow via at least one point of direct physical contact between a part of the object and a part of the tempering unit, in particular a tempering element of the tempering unit. Alternatively or in addition, a temperature increase may be realized by means of irradiation of the object with thermal radiation, for example infrared radiation, by means of the heating system. Tempering by means of the tempering unit is preferably controlled and/or regulated, in particular by means of the control and/or regulation unit. In particular, the temperature sensor together with the control and/or regulation unit forms a thermostat. The temperature sensor is realized in particular as a thermistor, as a semiconductor temperature sensor, as a thermal element, as a pyrometer or the like.

It is furthermore proposed that the tempering unit has at least one tempering element, in particular the above-mentioned tempering element, which makes physical contact with an object that is to be tempered by the tempering unit, in particular a wafer that is to be tempered by the tempering unit. An effective heat flow for a tempering can advantageously be made possible in this way. In particular, each object stored in the wafer transport container is assigned at least one tempering element, preferably a plurality of tempering elements. The tempering elements assigned to an object preferably make contact with the object such that the most uniform possible tempering of the object as a whole is made possible. For example, a plurality of coupled-together tempering elements makes contact with the object at as far as possible uniform intervals along a circumference of the object. The tempering element comprises in particular a heating element and/or a cooling element. By means of the cooling element, in particular, it is advantageously possible for cooling of an object to be assisted and/or accelerated, which can yield major advantages, for example a time saving, in particular in a vacuum environment, in which cooling normally takes place only very slowly owing to an absence of a heat transport medium. The heating element is embodied in particular as a resistance heating element, as a thermoelectric element, in particular as a Peltier element, and/or as a part of a heating circuit which is flowed through by a heating fluid. The cooling element is in particular embodied as a thermoelectric element, in particular a Peltier element, and/or as a part of a cooling circuit which is flowed through by a cooling fluid. It is furthermore conceivable for the heating element and/or the cooling element to be implemented as heat-conducting elements which exhibit particularly high heat conductivity and which are configured for producing heat-conducting contact with a heating and/or cooling source arranged in particular outside the wafer transport container.

The heating and/or cooling source is in particular assigned to a sub-component of the wafer transfer system. It is for example conceivable for the loading and/or unloading station to have a heating and/or cooling source, wherein a heat-conducting connection between the heating and/or cooling source and the at least one tempering element is produced upon docking of the wafer transport container onto the loading and/or unloading station. Alternatively or in addition, it is conceivable for the heating and/or cooling source to form a separate sub-component, implemented in particular as a tempering station, of the wafer transfer system. The wafer transport container transport system may in particular be configured for delivering a wafer transport container to the tempering station, for a tempering of the wafers contained therein, during the chip production process, preferably in a manner dependent on at least one parameter, for example a temperature, measured by means of a sensor.

If the tempering unit of the wafer transport container is configured for separate tempering, in particular heating and/or cooling, of at least two objects, in particular wafers, stored in the wafer transport container, it is advantageously possible for an extremely uniform temperature distribution within the wafer transport container to be made possible. It is furthermore advantageously possible for a temperature of an object to be adapted to particular characteristics of the object, and it is for example also possible in this way for different objects to be kept at different temperatures and/or brought to different temperatures. In particular, the tempering unit is configured for separately tempering three, four, five and/or a plurality, preferably all, of the objects stored in the wafer transport container. For this purpose, the tempering unit has tempering elements, in particular heat-conducting elements, which are decoupled from one another in terms of heat conduction and which are assigned in each case to the objects which are to be tempered separately.

It is furthermore proposed that the sensor module is configured at least for a separate capturing, in particular by means of two sensors implemented as temperature sensors, of a temperature of a first object, in particular wafer, stored in the wafer transport container and of a further temperature of a second object, in particular wafer, stored in the wafer transport container. In this way, a temperature distribution within the wafer transport container can be advantageously determined, whereby it is for example possible for different cooling rates of different objects to be registered. In particular, the sensor module is configured for separately determining the temperatures of three, four, five and/or a plurality, preferably all, of the objects stored in the wafer transport container.

If the wafer transport container has at least one vacuum pump, which is arrangeable on and/or in the wafer transport container, a direct adaptation of the inner pressure of the wafer transport container can advantageously be performed, in particular independently of a coupling to the loading and/or unloading station. In this way, an adequate volume can advantageously be maintained in the interior of the wafer transport container, in particular even during transport processes and/or during storage of the wafer transport container. A "vacuum pump" is in particular to mean a component which is configured for varying, preferably at least substantially reducing, a pressure in a closed space, for example the interior of the wafer transport container, wherein the pressure reduction is caused in particular by virtue of material being conveyed out of the interior of the wafer transport container and/or by virtue of material being collected and/or bound at a particular location. In particular, the pump is embodied as a positive-displacement pump, as a jet pump, as a molecular pump, in particular a turbomolecular pump, as a cryogenic pump and/or as a sorption pump. The statement that the vacuum pump "is arrangeable on the wafer transport container" is in particular to mean that the vacuum pump is fixedly connectable to the wafer transport container, preferably such that the vacuum pump is fixedly associated with the wafer transport container and is movable together with the wafer transport container during transport of the wafer transport container. The statement that the vacuum pump "is arrangeable in the wafer transport container" is in particular to mean that the vacuum pump is arranged at least partially, preferably entirely, in the interior of the wafer transport container.

In particular, the wafer transport container has at least one vacuum pump fastening unit which is configured for fastening the vacuum pump to the wafer transport container at a fixed position, in particular in non-positive locking fashion, for example by means of a screw connection or the like, and/or in positive locking fashion, for example by means of a clip-type and/or latch connection or the like. The connection by means of the vacuum pump fastening unit is preferably implemented to be releasable non-destructively and/or without the use of tools. In this way, it is advantageously possible for a vacuum pump to be switched back and forth between different wafer transport containers, and/or, in the event of decommissioning of a transport container, the vacuum pump can continue to be used, for example via mounting on a new wafer transport container. The vacuum pump is preferably configured for pumped evacuation of the closed wafer transport container, wherein a pumping process is performed in particular during storage and/or during transport of the wafer transport container.

In particular, it is conceivable for the wafer transfer system to have a sub-component which is implemented as a vacuum pump exchange station. The vacuum pump exchange station is configured in particular for arranging a vacuum pump on a wafer transport container, removing a vacuum pump from a wafer transport container and/or exchanging a vacuum pump assigned to a wafer transport container. The wafer transport container transport system is configured in particular for delivering wafer transport containers to the vacuum pump exchange station, preferably by means of automatic control by the central control and/or regulation unit of the fab and/or by means of manual control by an operator. The delivery of wafer transport containers to the vacuum pump exchange station is preferably performed on the basis of sensor data from at least one sensor, in particular from an inner pressure sensor, of the wafer transport container and/or on the basis of a prediction of the prediction module. In particular, wafer transport containers to which hitherto no vacuum pump has been assigned and whose inner pressure has overshot a particular pressure threshold value and/or whose prediction predicts an impending overshooting of the pressure threshold value are delivered to the vacuum pump exchange station. These wafer transport containers are assigned a vacuum pump by the vacuum pump exchange station. Furthermore, in particular, wafer transport containers to which a vacuum pump has already been assigned and whose inner pressure has undershot a particular pressure threshold value and/or whose prediction predicts a long period of time until an overshooting the pressure threshold value are delivered to the vacuum pump exchange station. The associated vacuum pump is removed from these wafer transport containers by the vacuum pump exchange station.

In particular, at least the control and/or regulation unit, preferably a control and/or regulation unit of an individual computer, assigned to a wafer transport container, of the data processing unit, is configured to control and/or regulate a pressure in the interior of the wafer transport container on the basis of sensor data of the sensor module by means of the vacuum pump. In particular, a vacuum pump assigned to a wafer transport container accordingly initiates an activation of the vacuum pump as soon as a set pressure threshold value has been overshot, and stops the vacuum pump as soon as a further set pressure threshold value has been undershot, wherein, in particular, the further pressure threshold value is significantly lower, preferably lower by at least one, preferably by at least two and preferably by at least three orders of magnitude, than the pressure threshold value.

If the vacuum pump comprises at least one getter, in particular an ion getter, and/or if at least one getter is arranged in the interior of the wafer transport container, simple and/or effective pressure regulation can advantageously be made possible. The getter may be implemented in particular as part of an ion getter pump, though the getter is preferably embodied independently from an ion getter pump. In particular, the getter is embodied as a nonvolatile getter. The getter is in particular implemented as a "bulk getter", which has an outer shape with an extremely large surface area, for example an arrangement of at least one, preferably multiple, plate(s), strip(s), wire(s) or the like. Alternatively or in addition, the getter may be implemented as a coating which is arranged in particular on a, preferably metallic, surface of the wafer transport container, preferably a surface of at least a portion of an inner wall of the wafer transport container and/or of the wafer transport container opening element, and/or on a, preferably metallic, surface of the wafer holding device. In particular, the getter is implemented at least partially of an alloy which comprises at least zirconium, vanadium, cobalt, aluminum, titanium, iron and/or cerium mischmetal.

If the wafer transport container has a releasable and/or exchangeable connection to the vacuum pump, a high level of flexibility can advantageously be achieved, in particular by virtue of the fact that only some of all of the wafer transport containers are assigned a vacuum pump, in particular in a manner dependent on the respective inner pressures. Furthermore, reusability of vacuum pumps assigned to sorted-out wafer transport containers can advantageously be made possible, whereby costs can be kept low. In particular, the releasable and/or exchangeable connection of the vacuum pump to the wafer transport container is realized by means of the above-mentioned vacuum pump fastening unit.

It is furthermore proposed that the wafer transport container has a vacuum-tight vacuum pump quick-coupling device, which is configured for releasable and/or exchangeable coupling of the vacuum pump, in particular of at least one suction inlet of the vacuum pump, to an interior of the wafer transport container. In this way, it is advantageously possible for an expenditure of time and/or work required for mounting, demounting and/or exchange of a vacuum pump to be kept low.

Furthermore, a loading and/or unloading station with a wafer transfer unit and with at least one sensor module having at least one sensor is proposed. In this way, it in particular advantageous characteristics regarding a transfer of at least one wafer between sub-components of a wafer transfer system, in particular between the wafer transport container, the loading and/or unloading station and/or a wafer processing module connected to the loading and/or unloading station, may be provided. Furthermore, monitoring of the wafers and/or of the environmental conditions around the wafers can advantageously be made possible, whereby it is possible in particular for faults, for example production faults, damage to wafers and/or contamination of wafers to be prevented.

It is furthermore proposed that the loading and/or unloading station has a central control and/or regulation unit, which is configured at least for a controlling and/or regulation of the data communication with at least one further sub-component of the wafer transfer system, in particular at least with a wafer processing module of the wafer transfer system, at least with a wafer transport container of the wafer transfer system, at least with a wafer transport container transport system of the wafer transfer system and/or at least with a wafer handling robot of the wafer transfer system, and/or of a data communication between at least two sub-components of the wafer transfer system and/or of a data communication of the loading and/or unloading station with an external data processing system. A reliable control of the transfer of wafers performed by means of the loading and/or unloading station can advantageously be made possible in this way. The central control and/or regulation unit of the loading and/or unloading station is in particular embodied integrally with the control and/or regulation unit of the wafer transfer unit; the central control and/or regulation unit of the loading and/or unloading station and the control and/or regulation unit of the wafer transfer unit are preferably identical. The central control and/or regulation unit of the loading and/or unloading station is in particular embodied at least partially integrally with the central control and/or regulation system of the fab, with the data processing unit and/or with at least one individual computer of the data processing unit. In particular, the data communication comprises at least an exchange of determined parameters, for example pressure values, of sensor datasets and/or of control commands for sub-components. The external data processing system is implemented in particular as the central control and/or regulation system of the fab and/or as a further data processing system outside the fab, for example a cloud or the like. In particular, the data communication of the central control and/or regulation unit of the loading and/or unloading station and/or the data communication of further sub-components of the wafer transfer system is configured such that compatibility with existing and/or established systems, for example existing wafer processing modules, existing wafer transport container transport systems and/or existing central control and/or regulation systems of a fab is ensured.

Also proposed is a wafer transfer system, in particular the above-mentioned wafer transfer system, with at least one wafer interface system comprising a wafer transport container and a loading and/or unloading station for a loading and/or unloading of the wafer transport container, and in particular with a wafer processing module, with at least one wafer transport container transport system and/or with at least one wafer handling robot. In this way, it is possible in particular to provide advantageous characteristics with regard to a transportation of at least one wafer, a storage of at least one wafer and/or a processing of at least one wafer, in particular within a fab.

It is furthermore proposed that the wafer transfer system comprises at least one wafer transport container transport system, which has a rail system and at least one transport carriage which is movable along the rail system, the wafer transport container transport system having at least one read point of a reader device at least for reading of at least one sensor module and/or of at least a portion of the data processing unit, in particular one individual computer of the data processing unit. An advantageous read pattern can be provided in this way. It is preferable for at least one read point to be arranged at a junction which is passed by all wafer transport containers at least once during a chip production process, whereby it can advantageously be ensured that the sensor data of all wafer transport containers are read in each case at least once. It is preferable for one read point to be arranged at each junction. It is particularly preferable for one read point to be arranged upstream and/or downstream of each sub-component of the wafer transfer system, which forms in particular a station in the chip production process and to which the wafer transport container transport system delivers at least one wafer transport container and from which the wafer transport container transport system picks up at least one wafer transport container. In this way, the central computer of the data processing unit, the control and/or regulation unit and/or the central control and/or regulation system of the fab advantageously receives updated sensor datasets at least after every loading and/or unloading of wafers into and/or out of the wafer transport container. A high level of process reliability can advantageously be achieved in this way.

If the read point is arranged in a proximity of at least one rail of the rail system and/or on the transport carriage, an easy read of sensor data can advantageously be made possible, in particular by virtue of the fact that, during a movement of the wafer transport container along the rail system, an automatic read of the sensor data is triggered in the event of a movement past the read point, and/or by virtue of the fact that, every time the wafer transport container moves into the proximity of the transport carriage, that is to say in particular every time the wafer transport container is received by the wafer transport container transport system, the automatic read of the sensor data is triggered. Furthermore, in the case of the read point being arranged in the proximity of the at least one rail of the rail system and/or in the case of the read point being arranged on the transport carriage, it is advantageously possible for, in particular energy-saving, NFC technology to be used for a read of the sensor data.

Also proposed is a method with at least one wafer transfer unit, with at least one wafer transport container, with at least one loading and/or unloading station and/or with at least one wafer transfer system. In this way, it is possible in particular to provide advantageous characteristics with regard to a transportation of at least one wafer, a storage of at least one wafer and/or a processing of at least one wafer, in particular within a fab.

Also proposed is a method having at least one wafer transport container and having at least one loading and/or unloading station, wherein a sequence of wafer transport containers for delivery to the loading and/or unloading station is fixedly specified on the basis of sensor data of the sensor modules of the wafer transport containers, in particular on the basis of predictions of prediction modules of data processing units of the wafer transport containers. A high level of process reliability can advantageously be achieved in this way. Furthermore, a high level of product quality can advantageously be achieved, in particular through the avoidance of storage of wafers for excessive lengths of time under sub-optimal conditions. Furthermore, in this way, it is advantageously possible for contamination of sub-components of the wafer transfer system to be kept low, whereby it is possible in particular to achieve a long service life of sub-components of the wafer transfer system. In particular, the central control and/or regulation system of the fab and/or the control and/or regulation unit specifies the sequence on the basis of received sensor datasets. In particular, for a specification of the sequence, particular parameter values from sensor datasets of different wafer transport containers are compared with one another and are preferably sorted into decreasing and/or increasing order. A sequence is then specified on the basis of the sorting of the parameter values. Here, it is conceivable for wafer transport containers with the best parameter values to assume a first position in the sequence, in order to obtain a batch of wafers with particularly good characteristics, or for wafer transport containers with the least optimal parameter values to assume the first position in the sequence, in order to realize the least possible waste production.

It is furthermore proposed that a wafer transport container whose sensor data lie outside a safe data range and/or whose prediction predicts a premature deviation of the sensor data from a safe data range is delivered with preference, for example to the loading and unloading station, and/or the wafer transport container is given a new location, situated further forward, in the sequence. In this way, it is advantageously possible to achieve a high average level of production quality, in particular through the prevention of storage of wafers for excessive lengths of time under sub-optimal conditions. Furthermore, in this way, it is advantageously possible for a risk of contamination of a sub-component of the wafer transfer system to be reduced, and for waste production to be lowered. In particular, in the event of a reallocation of a space in the sequence, all further spaces in the sequence are updated and overwritten. The control and/or regulation unit and/or the central control and/or regulation system of the fab is preferably configured for performing a redetermination of the sequence, in particular a resorting of the parameter values and/or of the wafer transport containers, at regular and/or irregular intervals, for example after the expiry of a particular time, for example one minute, after a registering of a set number of new arrivals of sensor datasets, preferably upon every new arrival of a sensor dataset, and/or after a registering of a set number of updates of sensor datasets, in particular upon every update of at least one sensor dataset.

It is furthermore proposed that a wafer transport container whose sensor data lie outside a safe data range and/or whose prediction predicts a premature deviation of the sensor data from the safe data range is, by means of the wafer transport container transport system, diverted to a regeneration station for wafer transport containers of the wafer transfer system, in particular the above-mentioned regeneration station, to a diagnostics station for wafer transport containers of the wafer transfer system, in particular the above-mentioned diagnostics station, and/or to a wafer check station for wafers. In this way, it is advantageously possible to achieve a high average level of production quality, in particular through the prevention of storage of wafers for excessive lengths of time under sub-optimal conditions. Furthermore, in this way, it is advantageously possible for a risk of contamination of a sub-component of the wafer transfer system to be reduced, and for waste production to be lowered. In particular, a division of the wafer transport container by means of the wafer transport container transport system is initiated by the control and/or regulation unit and/or by the central control and/or regulation system of the fab. A "wafer check station" is in particular to mean a device which is configured for checking at least one wafer for damage. In particular, the wafer check station forms a separate sub-component of the wafer transfer system.

Also proposed is a method with the wafer transfer system, with at least the loading and/or unloading station and with a plurality of wafer transfer units, respectively comprising at least one sensor module and respectively at least one part, implemented as an individual computer, of the data processing unit, wherein a dataset of all sensor data transmitted by the wafer transfer units is collected, and the dataset is used for control and/or regulation of at least one sub-component of the wafer transfer system, in particular of the wafer transport container transport system, by the central control and/or regulation unit of the loading and/or unloading station. In this way, it is possible to realize particularly advantageous, in particular particularly effective, controlling of the sub-component of the wafer transfer system, in particular of the wafer transport container transport system. In particular, control and/or regulation information items for an effective distribution, and/or effective logistics, of the wafer transport containers within the fab are determined from the dataset by the central control and/or regulation unit of the loading and/or unloading station. In particular, the distribution and/or the logistics of the wafer transport containers within the fab are/is organized and/or executed on the basis of the determined control and/or regulation information items by the central control and/or regulation unit of the loading and/or unloading station. Alternatively or in addition, the central control and/or regulation unit of the loading and/or unloading station transmits the determined control and/or regulation information items to the central control and/or regulation system of the fab, which then performs the organization and execution of the distribution, and/or the logistics, of the wafer transport containers within the fab.

Is furthermore proposed that the collected dataset is used for, in particular automatic, detection, localization and/or backtracking of at least one fault source, in particular by means of pattern recognition. In this way, it is advantageously possible for locating, circumventing and/or eliminating of fault sources to be simplified, whereby failure times can advantageously be reduced.

Here, the wafer transfer unit according to the invention, the wafer transport container according to the invention, the loading and/or unloading station according to the invention, the wafer transfer system according to the invention and the method according to the invention are not intended to be restricted to the use and embodiment described above. In particular, the wafer transfer unit according to the invention, the wafer transport container according to the invention, the loading and/or unloading station according to the invention, the wafer transfer system according to the invention and the method according to the invention may, in order to perform a function described herein, have a number of individual elements, components, method steps and units which differs from a number stated herein.

DRAWINGS

Further advantages will emerge from the following description of the drawings. The drawings illustrate an exemplary embodiment of the invention. The drawings, the description and the claims contain numerous features in combination. A person skilled in the art will expediently also consider the features individually and combine them to form further meaningful combinations.

Figure 2:
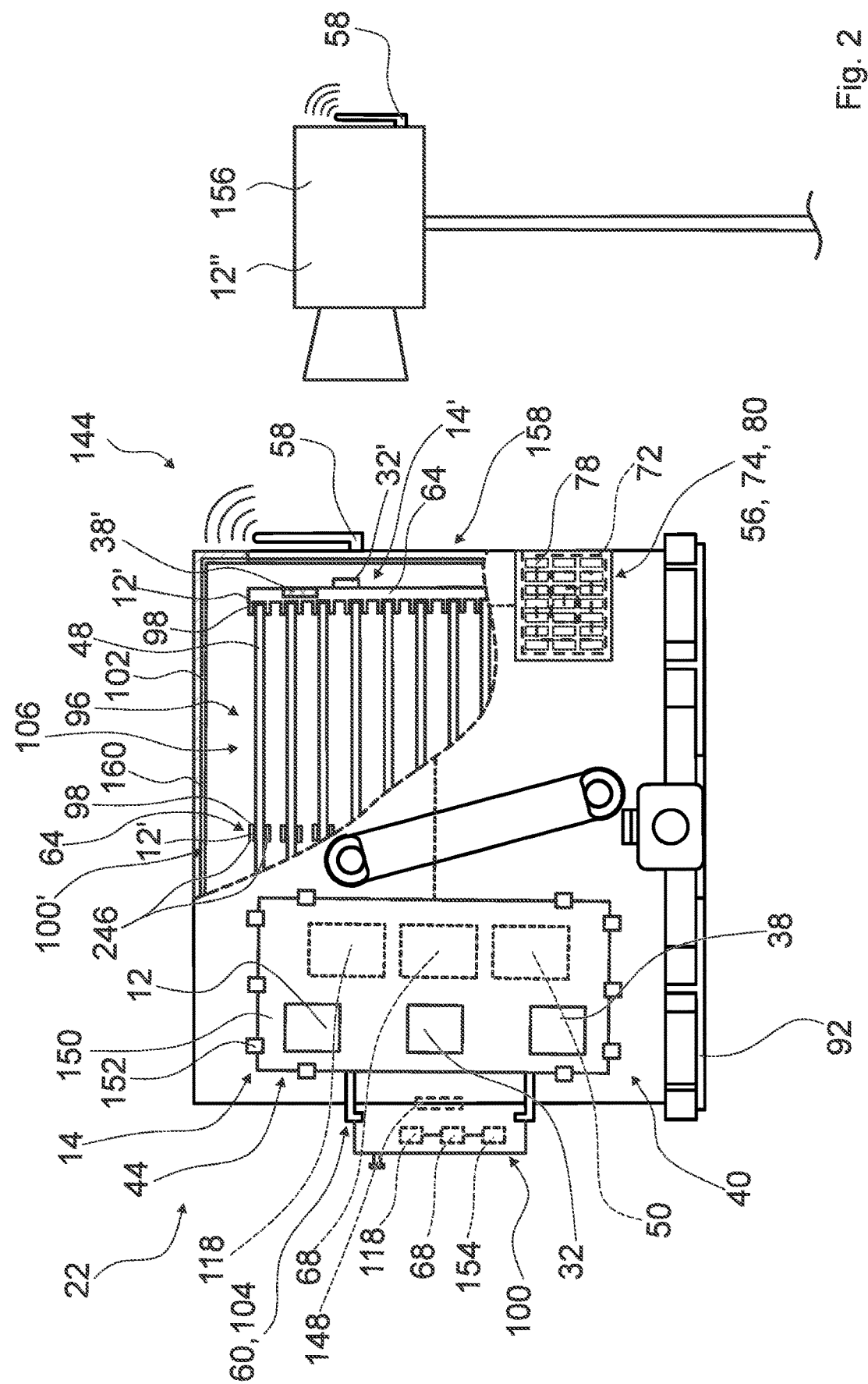
Figure 3:
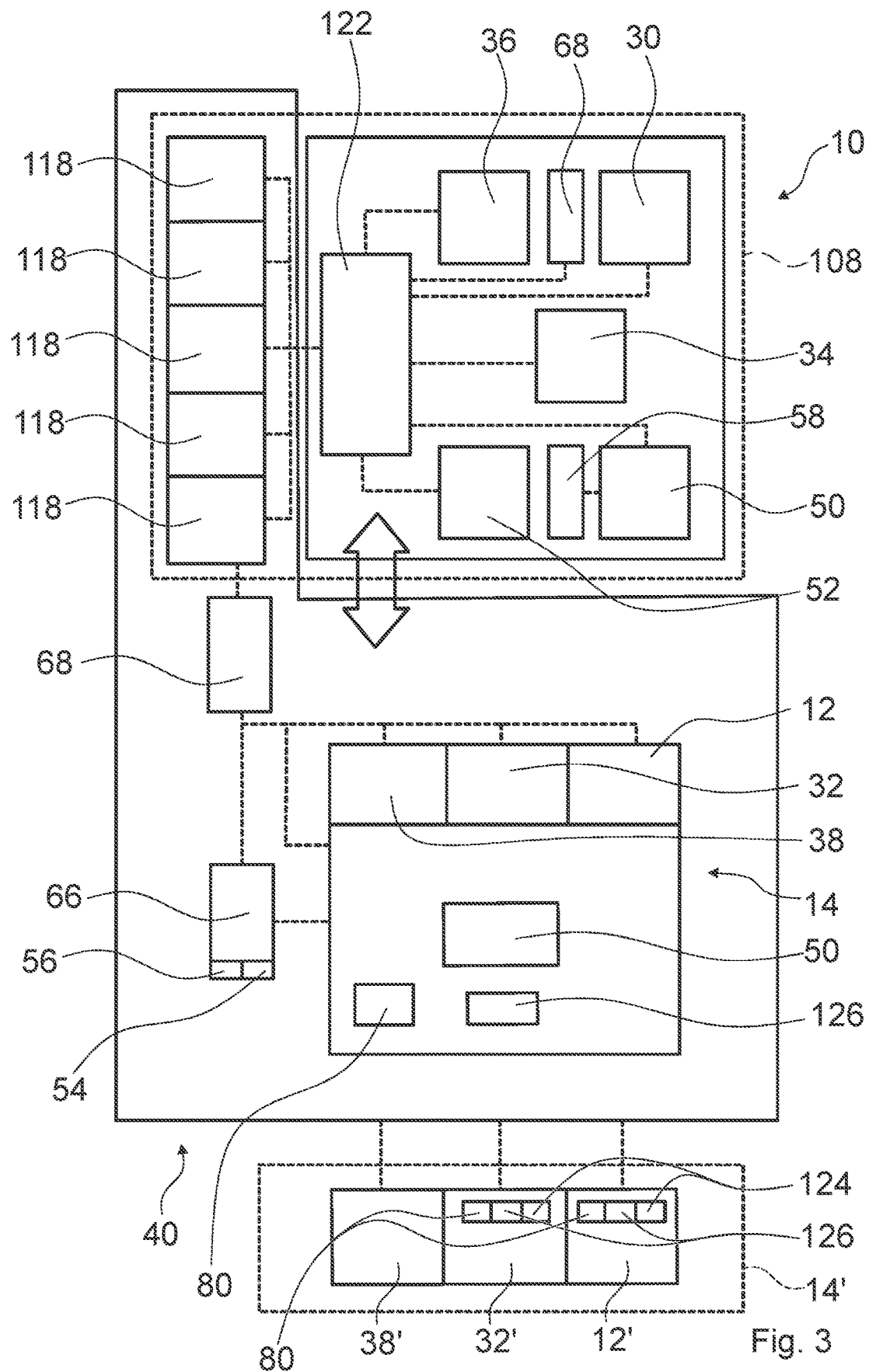
Figure 4:
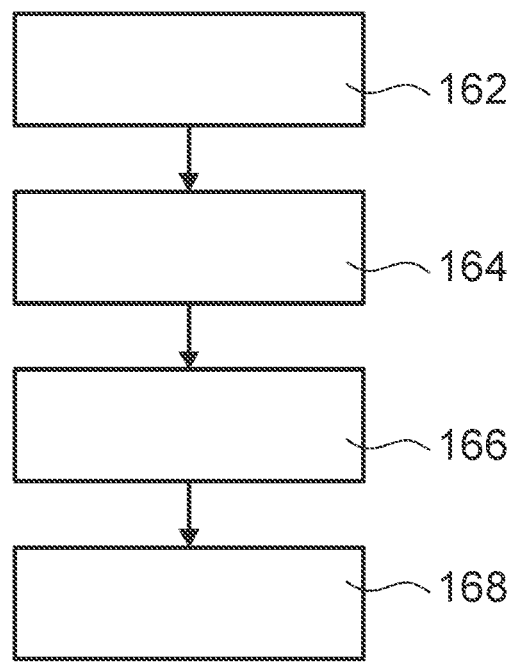
Figure 5:
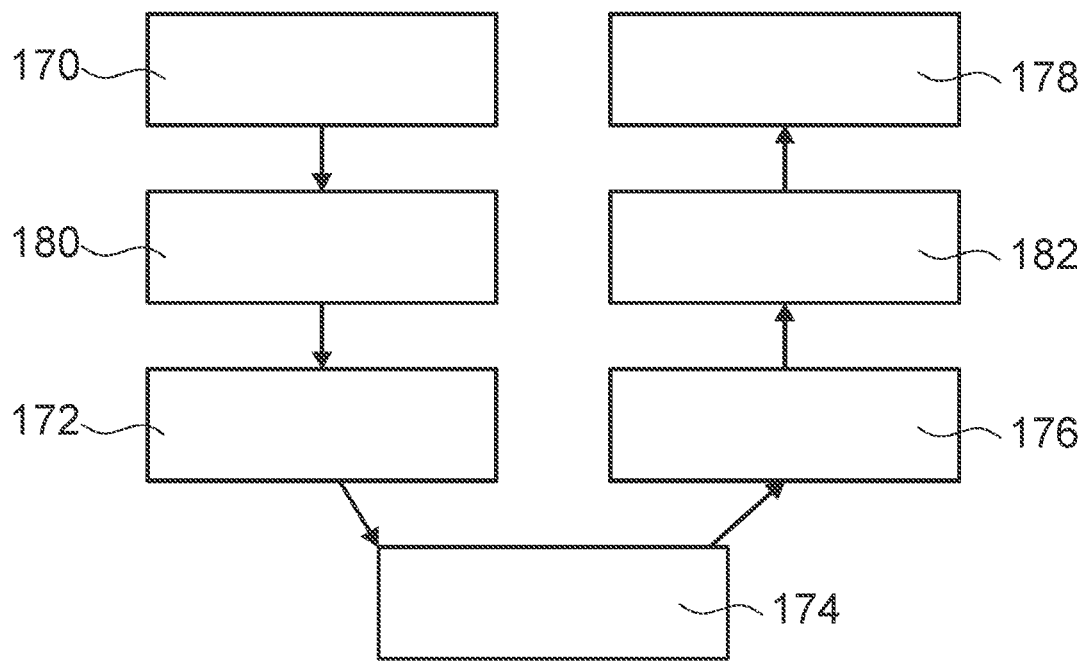
Figure 6:
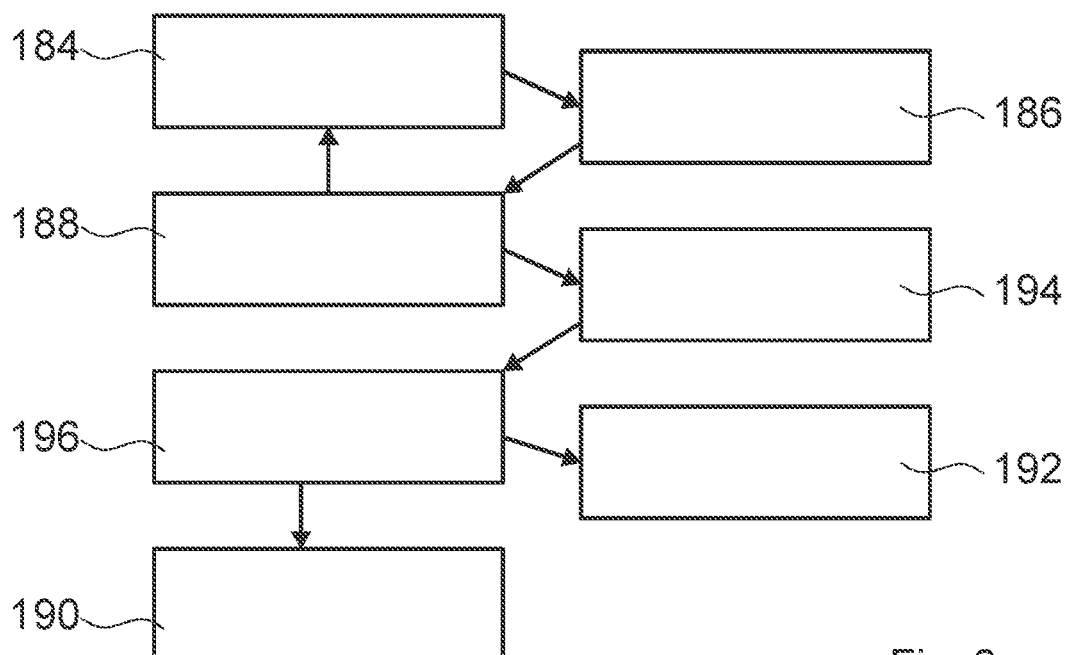
Figure 7:
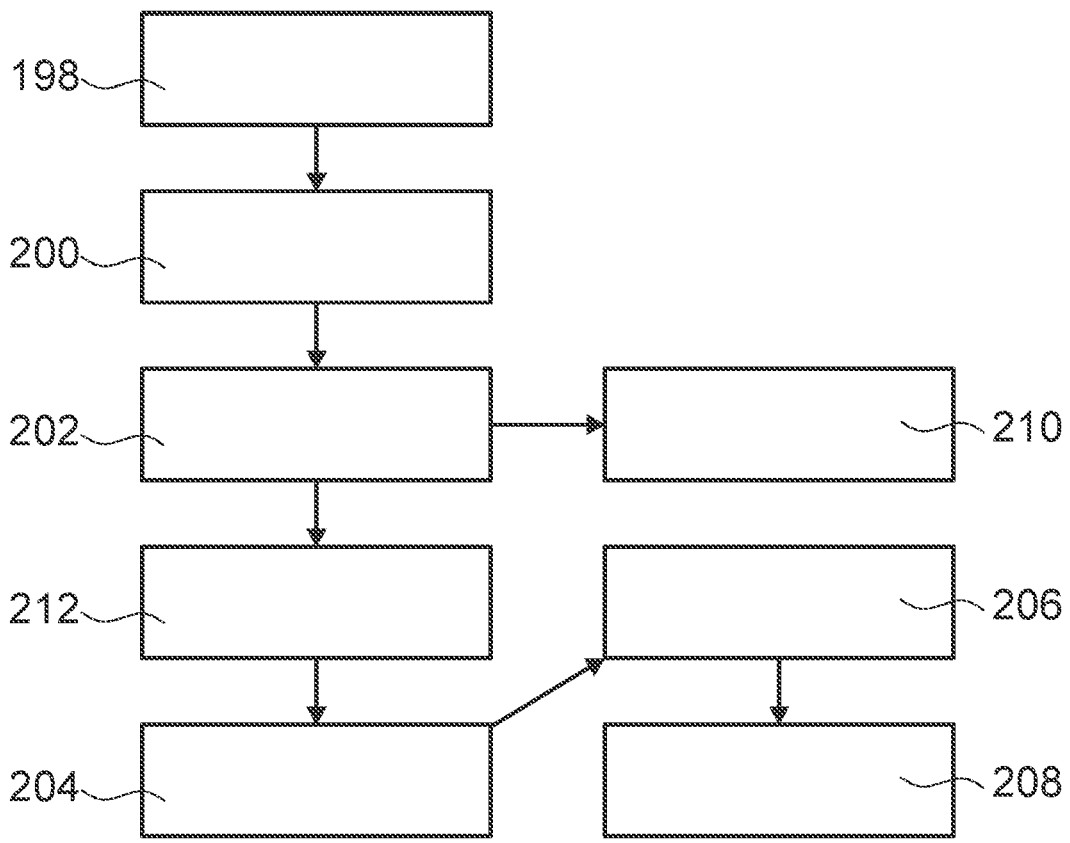
Figure 8:
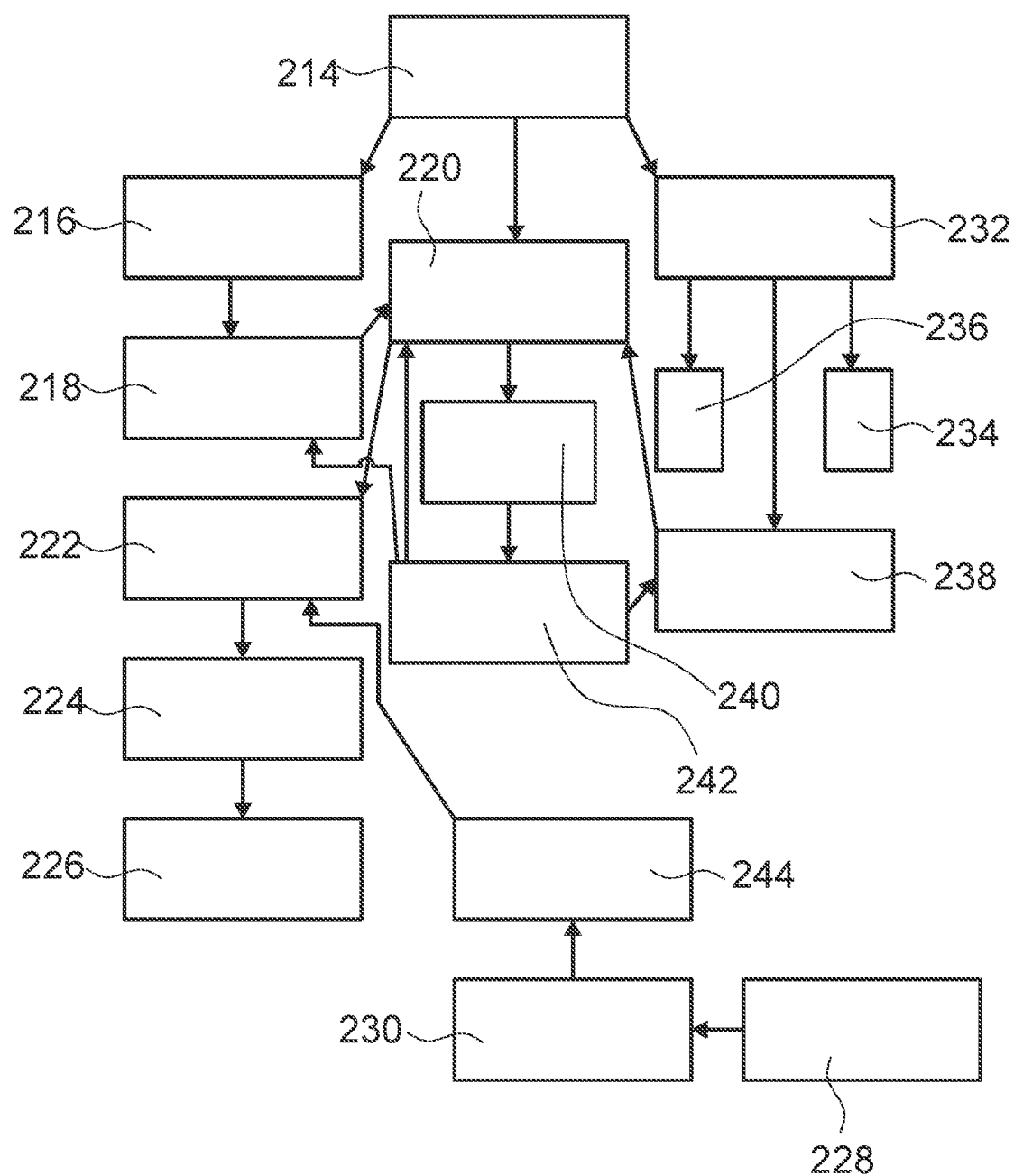

In the drawings:

FIG. 1 is a schematic illustration of a wafer transfer system having a wafer transfer unit, FIG. 2 is a schematic, partially sectional illustration of a sub-component, implemented as a wafer transport container, of the wafer transfer system, FIG. 3 is a schematic illustration of a measuring technology unit of the wafer transfer unit, FIG. 4 is a schematic flow diagram of a method for a coupling of the wafer transport container to a loading and/or unloading station of the wafer transfer system, FIG. 5 is a schematic flow diagram of a method for a wireless supply of energy to energy stores of the wafer transfer unit, FIG. 6 is a schematic flow diagram of a method for a check of geometrical deviations of a wafer within the wafer transfer system, FIG. 7 is a schematic flow diagram of a method for a read of sensor data, and FIG. 8 is a schematic flow diagram of a method for a controlling of the wafer transfer system.

DESCRIPTION OF THE EXEMPLARY EMBODIMENT

FIG. 1 is a schematic illustration of a wafer transfer system 16. The wafer transfer system 16 is arranged within a wafer fabrication environment (fab) 140. The fab 140 has a central control and/or regulation system 42. The central control and/or regulation system 42 is configured for a controlling of production processes, wafer production processes, logistics processes or the like within the fab 140. The central control and/or regulation system 42 has a central communication element 142. The central communication element 142 is configured at least for communication with sub-components of the wafer transfer system 16. The central communication element 142 is configured at least for communication with data transfer element 58 situated within the fab 140.

The wafer transfer system 16 has a wafer transfer unit 90. The wafer transfer system 16 comprises a plurality of sub-components. The wafer transfer system 16 comprises a wafer processing module 18. The wafer transfer system 16 preferably comprises a plurality of wafer processing modules 18. The wafer processing module 18 implements a sub-component of the wafer transfer system 16. The wafer processing module 18 has the wafer transfer unit 90.

The wafer transfer system 16 comprises a wafer interface system 20. The wafer interface system 20 comprises a wafer transport container 22. The wafer transfer system 16, or the wafer interface system 20, preferably comprises a plurality of wafer transport containers 22. The wafer transport container 22 implements a sub-component of the wafer transfer system 16. The wafer transport container 22 has the wafer transfer unit 90.

The wafer transport container 22 is configured for storage and/or for transport of objects 128. The object 128 is embodied as a wafer 48. Alternatively, the object 128 may also be implemented to differ from a wafer 48, for example as an exposure mask. Here, the object 128 is arranged in an interior 106 (cf. FIG. 2) of the wafer transport container 22. The wafer transport container 22 can be closed in vacuum-tight fashion. During transport and/or storage of an object 128 by means of the wafer transport container 22, the interior 106 of the wafer transport container 22 is evacuated. The wafer transport container 22 has a wafer transport container opening element 92 (cf. FIG. 2). The wafer transport container opening element 92 is configured for closing the wafer transport container 22 in vacuum-tight fashion. The wafer transport container opening element 92 is, during normal operation of the wafer transport container 22, arranged on a bottom side of the wafer transport container 22.

The wafer interface system 20 comprises a loading and/or unloading station 24. The wafer transfer system 16 or the wafer interface system 20 preferably comprises a plurality of loading and/or unloading stations 24. The loading and/or unloading station 24 forms a sub-component of the wafer transfer system 16. The loading and/or unloading station 24 has the wafer transfer unit 90. The loading and/or unloading station 24 is configured for loading and/or unloading of the objects 128. The loading and/or unloading station 24 is configured for loading and/or unloading of the wafer transport container 22. The loading and/or unloading station 24 is configured for loading and/or unloading of the wafer processing module 18. The loading and/or unloading station 24 is configured for permitting and/or at least partially performing a transfer of an object 128 between the wafer transport container 22 and a further sub-component of the wafer transfer system 16. During the transfer of the object 128 between the wafer transport container 22 and the further sub-component of the wafer transfer system 16 by means of the loading and/or unloading unit 24, the object 128 is situated permanently within a vacuum and/or within an evacuated environment.

The loading and/or unloading station 24 has a spindle unit (not shown) which is configured for moving the object 128 in a vertical direction, and in so doing moving the object 128 between the interior 106 of the wafer transport container 22 and an interior 138 of the loading and/or unloading station 24, during a loading and/or unloading process. The loading and/or unloading station 24 is configured to realize a local environment by means of an opening of the wafer transport container 22 by means of a lowering of the wafer transport container opening element 92 into the interior 138 of the loading and/or unloading station 24. The local environment takes the form of a mini-environment. The local environment serves for a wafer transfer process of wafers 48 between the wafer transport container 22 and the loading and/or unloading station 24, or the wafer processing module 18.

The loading and/or unloading station 24 has a central control and/or regulation unit 108. The central control and/or regulation unit 108 is configured for a control and/or regulation of a data communication of the loading and/or unloading station 24 with at least one further sub-component of the wafer transfer system 16. The central control and/or regulation unit 108 is configured for a control and/or regulation of a data communication between two or more sub-components of the wafer transfer system 16. The central control and/or regulation unit 108 is configured for a control and/or regulation of a data communication of the loading and/or unloading station 24 with an external data processing system, for example the central control and/or regulation system 42 of the fab 140.

The wafer transfer system 16 has a wafer handling robot 28. The wafer transfer system 16 preferably comprises a plurality of wafer handling robots 28. The wafer handling robot 28 forms a sub-component of the wafer transfer system 16. The wafer handling robot 28 has the wafer transfer unit 90. The wafer handling robot 28 is configured for manipulating an object 128. The wafer handling robot 28 is configured for moving objects 128 between the loading and/or unloading station 24 and a sub-component of the wafer transfer system 16, for example the wafer processing module 18. The wafer handling robot 28 is configured for loading and/or unloading of the loading and/or unloading station 24. The wafer handling robot 28 is configured for loading and/or unloading of a wafer holding device 64 (cf. FIG. 2). The wafer handling robot 28 is configured for loading and/or unloading a sub-component of the wafer transfer system 16, in particular of the wafer processing module 18. The wafer handling robot 28 is implemented to be rotatable, pivotable and movable in all three spatial directions. The wafer handling robot 28 has a gripper element 130. The gripper element 130 is implemented as a gripper arm. The gripper element 130 is configured for gripping the object 128 such that it cannot slip or fall down during subsequent manipulation.

The wafer transfer system 16 has a wafer transport container transport system 26. The wafer transport container transport system 26 forms a sub-component of the wafer transfer system 16. The wafer transport container transport system 26 has the wafer transfer unit 90. The wafer transport container transport system 26 has a transport carriage 112. The wafer transport container transport system 26 has a rail system 110. The rail system 110 has at least one rail 114. The transport carriage 112 is movable along the rail 114. The wafer transport container transport system 26 preferably has a plurality of transport carriages 112 which are moved simultaneously along the rail system 110.

The transport carriage 112 has an accommodating element 132. The accommodating element 132 is implemented as a means for preparation for holding a wafer transport container 22. The accommodating element 132 is configured to accommodate the wafer transport container 22 and to hold it relative to the transport carriage 112. For holding the wafer transport container 22, the accommodating element 132 has a mechanical arresting means (not shown). Alternatively, holding the wafer transport container 22 by the accommodating element 132 may also be realized by a coupling method that differs from a mechanical coupling, for example by magnetic retention or the like. A wafer transport container 22 which is held relative to the transport carriage 112 by means of the accommodating element 132 is movable along the entire rail system 110 by means of the wafer transport container transport system 26.

The transport carriage 112 has a suspension unit 134. The suspension unit 134 comprises a holding cable 136. The suspension unit 134 comprises a plurality of holding cables 136. The suspension unit 134 is configured for connecting the accommodating element 132 to the transport carriage 112. The holding cables 136 can be rolled up within the transport carriage 112. A spacing between the accommodating element 132 and the transport carriage 112 is variable by means of the suspension unit 134. The suspension unit 134 is configured for raising and/or lowering the accommodating element 132 (and thus also a wafer transport container 22 that is accommodated by the accommodating element 132) relative to the transport carriage 112.

The wafer transfer unit 90 has the sensor module 14. The sensor module 14 has a sensor 12. The sensor 12 of the sensor module 14 is assigned to a sub-component of the wafer transfer system 16. The sensor module 14 has a further sensor 32. The further sensor 32 of the sensor module 14 is assigned to the same sub-component of the wafer transfer system 16 as the sensor 12 of the sensor module 14. The sensor module 14 has an additional further sensor 38. The additional further sensor 38 is assigned to the same sub-component of the wafer transfer system 16 as the sensor 12 of the sensor module 14. The sensor 12 of the sensor module 14 is configured for determining a parameter. Sensors 12, 32, 38 of the sensor module 14 are configured for capturing parameters of sub-components of the wafer transfer system 16. Sensors 12, 32, 38 of the sensor module 14 are configured for outputting captured parameters of sub-components of the wafer transfer system 16 in readable form. The wafer transfer unit 90 has a plurality of sensor modules 14. A sensor module 14 is assigned to exactly one sub-component of the wafer transfer system 16. Alternatively, a sensor module 14 may be assigned to more than one sub-component of the wafer transfer system 16, and/or multiple sensor modules 14 may be assigned to the same sub-component of the wafer transfer system 16.

The further sensor 32 of the sensor module 14 is implemented substantially identically to the sensor 12 of the sensor module 14. The further sensor 32 of the sensor module 14 is configured for capturing the same parameter as the sensor 12 of the sensor module 14. The further sensor 32 of the sensor module 14 is configured to apply the same measuring method as the sensor 12 of the sensor module 14. The further sensor 32 of the sensor module 14 forms a sensor which is redundant in relation to the sensor 12 of the sensor module 14.

The additional further sensor 38 of the sensor module 14 is configured for determining the same parameter as the sensor 12 of the sensor module 14. To determine the parameter, the additional further sensor 38 of the sensor module 14 uses a measuring method which differs from the measuring method by means of which the sensor 12 of the sensor module 14 determines the parameter. Alternatively or in addition, the sensor module 14 has at least one, preferably a plurality of, sensor(s) which is/are configured for capturing the same parameter and/or further parameters which differ from the parameter.

The sensors 12, 32, 38 of the sensor module 14 assigned to the wafer transport container 22 are configured for detecting a parameter of the wafer transport container 22. The sensors 12, 32, 38 of the sensor module 14 assigned to the wafer transport container 22 are configured for detecting an environmental parameter of the interior 106 of the wafer transport container 22, in particular of the atmosphere prevailing in the interior 106 of the wafer transport container 22. A sensor 12, 32, 38, assigned to the wafer transport container 22, of the sensor module 14 is configured for detecting a parameter of a content of the wafer transport container 22, for example of an object 128 and/or of a wafer 48. The sensors 12, 32, 38 of the sensor module 14 assigned to the wafer transport container 22 and/or to the loading and/or unloading station 24 are configured for detecting, during the wafer transfer process, in which a local environment is implemented by the interior 138 of the loading and/or unloading station 24 and the interior 106 of the wafer transport container 22, parameters of the local environment.

The sensor module 14 is configured for separate capturing of a parameter of a first object 128 stored in the wafer transport container 22 and a further parameter of a second object 128 stored in the wafer transport container 22. The sensor module 14 is configured for separate capturing of a temperature of a first object 128 stored in the wafer transport container 22 and a further temperature of a second object 128 stored in the wafer transport container 22. The sensor module 14 is configured for respective separate capturing of a plurality of parameters and/or of temperatures of different objects 128 and/or wafers 48.

The wafer transport container 22 has an NFC interface 80. The sensor module 14 is connected in terms of data communication to the NFC interface 80 of the wafer transport container 22. The NFC interface 80 permits a read of sensor data of the sensor module 14 by means of a reader device 82 of the wafer transfer unit 90. Alternatively or in addition, the sensor module 14 directly has an NFC interface 80 (cf. FIG. 3). The NFC interface 80 is embodied as an RFID chip. The RFID chip is configured to be read by the reader device 82.

The wafer transport container 22 has a vacuum pump 100. The wafer transport container 22 has a vacuum pump fastening unit 60. The vacuum pump fastening unit 60 is implemented as a positive locking clip-type connection. The vacuum pump 100 can be arranged fixedly on the wafer transport container 22 by means of the vacuum pump fastening unit 60. The vacuum pump 100 is configured to regulate the inner pressure in the interior 106 of the wafer transport container 22. The vacuum pump 100 is configured for evacuating the interior 106 of the wafer transport container 22. The vacuum pump 100 can be controlled and/or regulated on the basis of sensor data of the sensor module 14. The vacuum pump 100 has a drive unit 154 (cf. FIG. 2). The drive unit 154 is configured for driving the pump mechanism of the vacuum pump 100. The drive unit 154 of the vacuum pump 100 is configured to interact with a part of a data processing unit 10 of the wafer transfer unit 90 for the purpose of controlling the pump mechanism. The vacuum pump 100 has an energy store 68 (cf. FIG. 2). The energy store 68 is configured to supply the drive unit 154 with electrical energy.

The vacuum pump 100 has a releasable connection to the wafer transport container 22. The vacuum pump 100 is implemented to be removable from the wafer transport container 22. The vacuum pump 100 is implemented to be exchangeable. The wafer transport container 22 has a vacuum pump quick-coupling device 104. The vacuum pump quick-coupling device 104 is configured for releasable and/or exchangeable coupling of the vacuum pump 100 to the interior 106 of the wafer transport container 22. The vacuum pump quick-coupling device 104 is of vacuum-tight design. The wafer transport container 22 has a seal element 148. The seal element 148 is configured for ensuring a leak-tightness of the wafer transport container 22, or an integrity of the vacuum in the interior 106 of the wafer transport container 22, in the event of a removal and/or in the event of an exchange of the vacuum pump 100 by means of the vacuum pump quick-coupling device 104.

The wafer transport container 22 comprises a getter 102 (cf. FIG. 2). The getter 102 forms an alternative and/or additional vacuum pump 100'. The getter 102 shown in FIG. 2 is arranged in the interior 106 of the wafer transport container 22. The getter 102 is implemented as a coating of an inner wall 160 of the wafer transport container 22. Alternatively or in addition, the getter 102 may also be implemented as a coating of at least a portion of a further component, for example a wafer rack, situated in the interior 106 of the wafer transport container 22. The getter 102 is configured for absorbing and/or binding molecules and/or particles that are situated in the interior 106 of the wafer transport container 22. The getter 102 is implemented to be regenerable. Alternatively or in addition, the getter 102 may be implemented as a separate component which is arranged within the interior 106 of the wafer transport container 22 and/or within the vacuum pump 100.

The wafer transfer system 16 has a vacuum pump exchange station 84. The vacuum pump exchange station 84 forms a sub-component of the wafer transfer system 16. The vacuum pump exchange station 84 has the wafer transfer unit 90. The vacuum pump exchange station 84 forms a separate station to which the wafer transport container transport system 26 can move. By means of the wafer transport container transport system 26, wafer transport containers 22 whose vacuum pump 100 and/or getter 102 are/is to be exchanged and/or removed are delivered to the vacuum pump exchange station 84. By means of the wafer transport container transport system 26, wafer transport containers 22 to which a vacuum pump 100 and/or a getter 102 are/is to be assigned are delivered to the vacuum pump exchange station 84. The vacuum pump exchange station 84 is configured for releasing and/or connecting the vacuum pump quick-coupling device 104 in automated fashion.

The wafer transfer unit 90 has the data processing unit 10 (cf. also FIG. 3). The data processing unit 10 is configured for registering sensor data of the sensors 12, 32, 38 of the sensor module 14. The data processing unit 10 is configured for processing sensor data of the sensors 12, 32, 38 of the sensor module 14. The data processing unit 10 comprises an individual computer 118. The data processing unit 10 preferably comprises a plurality of individual computers 118. At least a portion of the data processing unit 10, in particular one individual computer 118 of the data processing unit 10, is assigned to a wafer transport container 22. At least one further part of the data processing unit 10, in particular one further individual computer 118 of the data processing unit 10, is assigned to the loading and/or unloading station 24. At least one additional further part of the data processing unit 10, in particular one additional further individual computer 118, is assigned to an additional further sub-component of the wafer transfer system 16.

At least one individual computer 118 is assigned to each sensor 12, 32, 38. Each sub-component of the wafer transfer system 16 which is at least partially assigned at least one sensor module 14 is assigned at least one individual computer 118. In particular, each sub-component of the wafer transfer system 16 which is at least partially assigned at least one sensor module 14 is assigned at least one individual computer 118. The data processing unit 10 has an NFC interface 80. The NFC interface 80 is configured for processing, or transmitting and/or receiving, sensor data.

The individual computers 118 of the data processing unit 10 are networked together. The parts of the data processing unit 10, in particular the part and the further part of the data processing unit 10, are configured for exchanging sensor data with one another. The data processing unit 10 comprises a data transfer unit 144. The data transfer unit 144 is configured for transmitting data, for example sensor data and/or control data, between individual computers 118 of the data processing unit 10. The data transfer unit 144 is configured for transmitting data, for example sensor data and/or control data, between the data processing unit 10 and the central control and/or regulation system 42 of the fab 140. The data transfer unit 144 is configured for communicating with the central communication element 142. A data transfer may be effected in particular at least partially by means of an NFC interface 80.

The data transfer unit 144 comprises a data transfer element 58. The data transfer element 58 is implemented as a receiver and/or transmitter for electronic data. The data transfer element 58 is embodied as an antenna. The data transfer unit 144 preferably comprises a plurality of data transfer elements 58. Each individual computer 118 is assigned at least one data transfer element 58. Each sub-component of the wafer transfer system 16 is assigned at least one data transfer element 58. In particular, each sub-component of the wafer transfer system 16 has at least one data transfer element 58.

The data processing unit 10 comprises the central control and/or regulation unit 108. The data processing unit 10 has a central computer 122 (cf. FIG. 3). The central computer 122 forms a part of the central control and/or regulation unit 108. The central computer 122 is configured for performing calculation tasks of the data processing unit 10. The central computer 122 is configured for coordinating calculation tasks of the data processing unit 10. The central computer 122 is configured for distributing calculation tasks of the data processing unit 10 to individual sub-components of the data processing unit 10, for example individual modules and/or individual computers 118. The central computer 122 communicates with the further sub-components of the data processing unit 10 in particular by means of a direct physical data connection or by means of a wireless data connection of the data transfer unit 144. The central computer 122 is configured for exchanging data and/or commands, for example control instructions, with the central control and/or regulation system 42 of the fab 140 by means of the data connection of the data transfer unit 144. The data processing unit 10, or programming of an operating program of the data processing unit 10, is implemented to be post- and/or re-programmable.

The sensor module 14 has a memory module 50. The data processing unit 10 has a memory module 50. The sensor module 14 and/or the data processing unit 10 preferably have a plurality of memory modules 50. The memory module 50 of the data processing unit 10 is embodied integrally with, in particular identically to, the memory module 50 of the sensor module 14. Alternatively or in addition, each sensor 12, 32, 38 and/or each individual computer 118 may have a memory module 50. The memory module 50 of the sensor module 14 is configured for storage of a course of sensor data of the sensor 12, 32, 38 of the sensor module 14. The memory module 50 of the data processing unit 10 is configured for storing a course of sensor data of the sensor 12, 32, 38 of the sensor module 14 and/or for storing calculations of the data processing unit 10 and/or of individual computers 118. The memory module 50 is connected in terms of data communication to the NFC interface 80 of the wafer transport container 22.

The data processing unit 10 has a prediction module 30 (cf. FIG. 3). The prediction module 30 is configured for receiving sensor data from the central computer 122 and/or the individual computers 118. The prediction module 30 is configured for transmitting predictions to the central computer 122 and/or to an operator, or a display unit (not shown). The prediction module 30, or programming of an operating program of the prediction module 30 and/or of prediction generation rules of the operating program of the prediction module 30, are/is implemented to be post- and/or re-programmable.

The prediction module 30 is configured for generating a prediction for a future result and/or a future event on the basis of sensor data of the sensor 12, 32, 38 of the sensor module 14. The prediction module 30 is configured for generating a prediction for a future result and/or for a future event on the basis of a parameter value determined with the aid of the sensor 12, 32, 38. The prediction module 30 is configured for generating a prediction for a future course of sensor data of the sensor 12, 32, 38 of the sensor module 14 on the basis of a course of sensor data of a sensor 12, 32, 38 of the sensor module 14. The prediction module 30 is configured for generating the prediction for a future event, a future result and/or for a future course of a sensor dataset on the basis of a combination and/or on the basis of a comparison of sensor data of two or more than two sensors 12, 32, 38 of the sensor module 14. The prediction module 30 is configured for generating, from the determined future courses of the sensor data of the sensor 12, 32, 38 of the sensor module 14, a prediction for a period of time that passes before an occurrence of a deviation of the sensor data of the sensor 12, 32, 38 of the sensor module 14 from a safe data range. The prediction module 30 is configured for performing pattern recognition on the basis of the sensor datasets of the sensors 12, 32, 38 of the sensor module 14 for the purposes of generating the prediction.

The data processing unit 10 has a control and/or regulation unit 34 (cf. also FIG. 3). The control and/or regulation unit 34 is configured for receiving predictions of the prediction module 30 and/or sensor data and/or commands from the central computer 122 and/or from the individual computers 118. The control and/or regulation unit 34 is configured for transmitting control and/or regulation commands to the central computer 122, to an operator, or the display unit, to the central control and/or regulation system 42 of the fab 140 and/or to a sub-component of the wafer transfer system 16. The control and/or regulation unit 34, or programming of an operating program of the control and/or regulation unit 34 and/or of control and/or regulation specifications that can be output by the control and/or regulation unit 34, are implemented to be post- and/or re-programmable.

The control and/or regulation unit 34 is configured for controlling and/or regulating the logistics of at least one wafer transport container 22 by means of the wafer transport container transport system 26 on the basis of sensor data. The control and/or regulation unit 34 is configured for a controlling and/or regulation of the logistics of the wafer transport containers 22 by means of the wafer transport container transport system 26 on the basis of predictions determined by the prediction module 30. The control and/or regulation unit 34 is configured for a controlling and/or regulation of the logistics of the wafer transport container 22 by means of the wafer transport container transport system 26 on the basis of predictions and/or sensor data evaluated by the central computer 122.

The control and/or regulation unit 34 is configured for initiating an adaptation of at least one parameter of a sub-component of the wafer transfer system 16 on the basis of the prediction of the prediction module 30. The control and/or regulation unit 34 is configured for preventing a deviation of a parameter of the wafer transport container 22 from a safe data range. Furthermore, the control and/or regulation unit 34 is also configured for preventing a deviation of a parameter of a further sub-component of the wafer transfer system 16 from a safe data range.

The data processing unit 10 has a machine learning module 36 (cf. FIG. 3). The machine learning module 36 is configured for optimizing, by means of machine learning, the prediction(s) determined by the prediction module 30. The machine learning module 36 is configured for optimizing, by means of machine learning, a reaction to the prediction(s) determined by the prediction module 30. The machine learning module 36 is configured for receiving predictions of the prediction module 30 and/or sensor data and/or commands from the central computer 122 and/or from the individual computers 118. The machine learning module 36 is configured for modifying and/or re-programming control and/or regulation commands of the central computer 122, of the control and/or regulation unit 34 and/or of the individual computers 118. The machine learning module 36 is configured for re-programming the prediction module 30. The machine learning module 36 is configured for modifying rules of the prediction module 30 that are used for generating the prediction, and/or for specifying new rules for generating a prediction.

The data processing unit 10 has an evaluation module 52. The evaluation module 52 is configured for evaluating at least one course of sensor data of sensors 12, 32, 38 of the sensor module 14. The evaluation module 52 comprises an automatic fault detection means. The automatic fault detection means of the evaluation module 52 is configured for detecting a malfunction of at least one of the sensors 12, 32, 38 of the sensor module 14. The automatic fault detection means of the evaluation module 52 is configured for detecting abnormal sensor data of at least one of the sensors 12, 32, 38 of the sensor module 14. The evaluation module 52 is configured for receiving sensor data from the central computer 122, the individual computers 118 and/or the sensor modules 14. The evaluation module 52 is configured for outputting information items relating to detected faults to the central computer 122, to a data transfer element 58 for wireless transmission to a central control and/or regulation system 42 of the fab 140, and/or to an operator or a display unit.

The wafer transfer unit 90 has an alarm module 94. The wafer transfer unit 90 preferably has a plurality of alarm modules 94. The alarm module 94 is configured for outputting a warning in the event of a detection of a deviation of sensor data of one of the sensors 12, 32, 38 from a safe data range. The alarm module 94 is configured for outputting a warning in the event of a detection of a malfunction of at least one sub-component of the wafer transfer system 16, for example by means of the evaluation module 52. The warning takes the form of an acoustic signal. The warning takes the form of an optical signal. The warning comprises a transmission of a warning message to an operator by means of the data transfer unit 144. The alarm module 94 is assigned to the wafer transport container 22. Furthermore, each sub-component of the wafer transfer system 16 has a separate alarm module 94. Alternatively or in addition, a sub-component of the wafer transfer system 16 may have a plurality of alarm modules 94 for outputting a variety of warnings and/or one alarm module 94 with multiple alarm-outputting capabilities and/or one alarm module 94 may be assigned to more than one sub-component of the wafer transfer system 16.

The wafer transfer unit 90 has an energy store 68. The energy store 68 is embodied as a battery. The battery is implemented as a rechargeable accumulator. The energy store 68 is configured for supplying energy to the sensors 12, 32, 38 of the sensor module 14. The energy store 68 is configured for supplying energy to the data processing unit 10. The energy store 68 is configured for supplying energy to the individual computers 118 of the data processing unit 10. The energy store 68 is configured for supplying energy to the data transfer unit 144. The energy store 68 is configured for supplying energy to the data transfer elements 58. Separate energy stores 68 are assigned to each sub-component of the wafer transfer system 16. It is alternatively or additionally conceivable for separate energy stores 68 to be assigned to each sensor 12, 32, 38 and/or each individual computer 118.

The wafer transfer unit 90 has a charging module 66. The charging module 66 is configured for supplying charging energy to energy stores 68. The transmission of the charging energy by means of the charging module 66 to the energy stores 68 is performed contactlessly. The charging module 66 comprises an energy transmitter element 54. The charging module 66 comprises an energy receiver element 56. The energy transmitter element 54 and the energy receiver element 56 are implemented separately from one another. The energy transmitter element 54 and the energy receiver element 56 are arranged so as to be free from contact with one another during charging operation. The energy transmitter element 54 is arranged in a proximity of the loading and/or unloading station 24. Alternatively or in addition, the energy transmitter element 54 may be arranged at further locations within the fab 140, for example in a proximity of the wafer transport container transport system 26, in particular of the rails 114 of the wafer transport container transport system 26 and/or in a proximity of a further sub-component of the wafer transfer system 16.

The wafer transfer unit 90 has a charging energy supply module 88. The charging energy supply module 88 is configured for contactlessly providing charging energy during a charging process by means of the charging module 66. The charging energy supply module 88 is configured for emitting the charging energy into the free space during a charging process by means of the charging module 66. The charging energy supply module 88 may comprise an RFID read unit. The energy transmitter element 54 is implemented as the charging energy supply module 88. The energy receiver element 56 is configured for receiving, preferably at least partially absorbing, the energy emitted into the free space by the charging energy supply module 88.

The charging module 66 has a conductive track 72 (cf. FIG. 2). The conductive track 72 is assigned to the energy receiver element 56. The conductive track 72 has a coiled form. The conductive track 72 is configured for extracting charging energy from an electrical and/or magnetic field and converting it into electrical energy. The energy extracted by means of the conductive track 72 is configured for charging the energy store 68. The conductive track 72 is implemented as a part of an RFID chip. Alternatively or in addition, the conductive track 72 may be implemented as a part of an induction charging system.

The wafer transfer unit 90 comprises a photocell unit 74. The charging module 66 comprises the photocell unit 74. The photocell unit 74 comprises a plurality of photocells 78. The photocell unit 74 is implemented as a part of the energy receiver element 56. The photocell unit 74 is configured for converting irradiated light into electrical energy. The photocell unit 74 is configured for supplying charging energy to an energy store 68, in particular to the energy store 68 of the sensor module 14 and/or of the data processing unit 10. The charging module 66 comprises an illumination unit 76. The illumination unit 76 is configured for illuminating at least one photocell 78 of the photocell unit 74. The illumination of the photocell unit 74 by means of the illumination unit 76 constitutes a contactless energy transfer.

The wafer transfer unit 90 has the reader device 82. The wafer transfer unit 90 preferably has a plurality of reader devices 82, wherein the reader devices 82 are preferably arranged at important junctions of the wafer transfer system 16. For example, the reader devices 82 are arranged in a proximity of crossing points of the rail system 110 of the wafer transport container transport system 26 and/or in a proximity of the transport carriage 112 of the wafer transport container transport system 26. The reader device 82 is configured for triggering a read of information items of the data processing unit 10, in particular of the memory module 50, and/or of the sensor module 14. The reader device 82 is configured for reading sensor data of sub-components of the wafer transfer system 16, identifiers of partial components of the wafer transfer system 16 and/or program commands of the data processing unit 10.

The reader device 82 comprises an NFC interface 80. The reader device 82 comprises an RFID read unit. The reader device 82 is implemented partially integrally with the charging module 66 and/or the charging energy supply module 88. Alternatively, the reader device 82 may also comprise a system alternative to an RFID system for a triggered electronic data transfer. The reader device 82 has a data transfer element 58. The data transfer element 58 serves for a wireless transmission of read data within the data transfer unit 144. The data transfer element 58 is configured for transferring data read by the reader device 82 to the central control and/or regulation system 42 of the fab 140 and/or to the central computer 122.

The reader device 82 has a read point 86. The read point 86 is implemented as a region within which a read is possible by means of the reader device 82. The wafer transport container transport system 26 has a plurality of read points 86 of the reader device 82 for a read of at least one sensor module 14 and/or at least a portion of the data processing unit 10 of a wafer transport container 22. The read points 86 of the wafer transport container transport system 26 are arranged in the proximity of rails 114 of the rail system 110 and/or in the proximity of the transport carriage 112.

The reader device 82 is configured for triggering a data communication of the data processing unit 10 when the data processing unit 10 is positioned in a proximity of the read point 86. The reader device 82 is configured for triggering data communication of that part of the data processing unit 10 which is assigned to that sub-component of the wafer transfer system 16 which has been moved into the proximity of the read point 86, for example the data communication of an individual computer 118 of the wafer transport container 22, when an NFC interface 80, for example the NFC interface 80 of the wafer transport container 22, is positioned in the proximity of the read point 86.

The wafer transfer system 16 has a diagnostics station 46. The diagnostics station 46 forms a sub-component of the wafer transfer system 16. The diagnostics station 46 has the wafer transfer unit 90. The diagnostics station 46 forms a separate station to which the wafer transport container transport system 26 can move and which has a read point 86 for a read of sensor data of a wafer transport container 22. Wafer transport containers 22 whose sensor data are to be read at an unscheduled point in time are delivered by means of the wafer transport container transport system 26 to the diagnostics station 46.

The wafer transfer system 16 has a wafer check station 116. The wafer check station 116 forms a sub-component of the wafer transfer system 16. The wafer check station 116 has the wafer transfer unit 90. The wafer check station 116 forms a separate station to which the wafer transport container transport system 26 can move and which is configured for checking at least one wafer 48 for damage. The wafer check station 116 is connected to a wafer unloading station 146 which is configured for unloading a wafer 48 from the wafer transport container 22 and transferring said wafer to the wafer check station 116. The wafer unloading station 146 is implemented substantially identically to the loading and/or unloading station 24. A transfer of a wafer 48 between the wafer transport container 22 and the wafer check station 116 by means of the wafer unloading station 146 is performed in a closed-off vacuum environment.

The wafer transfer system 16 has a reloading station 120. The reloading station 120 forms a sub-component of the wafer transfer system 16. The reloading station 120 has the wafer transfer unit 90. The reloading station 120 forms a separate station to which the wafer transport container transport system 26 can move and which is configured for reloading a content of one wafer transport container 22, for example an object 128 or a wafer 48, into a further wafer transport container 22. The reloading station 120 forms the wafer unloading station 146. A reloading of the content from one wafer transport container 22 to the further wafer transport container 22 by means of the reloading station 120 is performed in a closed-off vacuum environment.

The wafer transfer system 16 has an external pump station 62. The external pump station 62 forms a sub-component of the wafer transfer system 16. The external pump station 62 has the wafer transfer unit 90. The external pump station 62 forms a separate station to which the wafer transport container transport system 26 can move and which is configured for coupling to the wafer transport containers 22 and regulating or lowering the inner pressure of the wafer transport containers 22. The reloading station 120 forms the external pump station 62.

The wafer transfer system 16 has a regeneration station 70. The regeneration station 70 forms a sub-component of the wafer transfer system 16. The regeneration station 70 has the wafer transfer unit 90. The regeneration station 70 forms a separate station to which the wafer transport container transport system 26 can move and which is configured for regenerating, that is to say improving, at least one parameter of the wafer transport container 22, for example an inner pressure and/or a level of contamination. The regeneration station 70 may in particular form a wafer transport container cleaning station.

The wafer transfer unit 90 has a measuring technology unit 40. The measuring technology unit 40 comprises a sensor module 14 with sensors 12, 32, 38. The measuring technology unit 40 comprises a part of the data processing unit 10. The measuring technology unit 40 comprises an individual computer 118 of the data processing unit 10. The measuring technology unit 40 comprises a memory module 50. The measuring technology unit 40 comprises an energy store 68. The energy store 68 of the measuring technology unit 40 is embodied as a battery. The energy store 68 of the measuring technology unit 40 is implemented to be rechargeable. The energy store 68 of the measuring technology unit 40 is implemented to be exchangeable. In this way, a long service life of the measuring technology unit 40 can advantageously be made possible.

FIG. 2 is a schematic illustration of a sub-component, implemented as a wafer transport container 22, of the wafer transfer system 16. The measuring technology unit 40 is arranged on the wafer transport container 22. The measuring technology unit 40 is mounted fixedly on the sub-component of the wafer transfer system 16, which is illustrated here by way of example as wafer transport container 22. The measuring technology unit 40 forms a coherent assembly. The measuring technology unit 40 is configured for exchangeable arrangement on the sub-component of the wafer transfer system 16. The coherent assembly group of the measuring technology unit 40 is mountable as a single piece on the sub-component of the wafer transfer system 16, which is illustrated here by way of example as wafer transport container 22. The coherent assembly of the measuring technology unit 40 can be demounted in one single piece from the sub-component of the wafer transfer system 16, which is illustrated here, by way of example, as a wafer transport container 22. The measuring technology unit 40 has a housing unit 150. The individual components of the measuring technology unit 40, for example the sensors 12, 32, 38, the individual computer 118, the memory module 50 and/or the energy store 68, are arranged at least partially within the housing unit 150.

The wafer transfer unit 90 has a quick-coupling device 44. The quick-coupling device 44 is configured for releasable coupling of the measuring technology unit 40 to the sub-component of the wafer transfer system 16, which is illustrated here by way of example as wafer transport container 22. The quick-coupling device 44 of the wafer transfer unit 90 is configured for exchangeable coupling of the measuring technology unit 40 to the sub-component of the wafer transfer system 16, which is illustrated here by way of example as wafer transport container 22. The quick-coupling device 44 comprises a plurality of assembly elements 152. The assembly elements 152 are embodied as latch lugs for a clip-type connection. The assembly elements 152 are embodied integrally with the sub-component of the wafer transfer system 16. The assembly elements 152 are configured for engaging into corresponding assembly elements (not shown) of the measuring technology unit 40.

The wafer transfer unit 90 has the wafer holding device 64. The wafer holding device 64 is embodied as a wafer rack. The wafer holding device 64 is configured for retaining wafers 48 in a fixed position. The wafer holding device 64 is configured for retaining wafers 48 so as to secure them against slipping. The wafer holding device 64 is configured for retaining wafers 48 in a manner stacked vertically one above the other. Wafers 48 are retained by means of the wafer holding device 64 such that adjacent wafers 48 have no points of contact with one another. Wafers 48 are retained by means of the wafer holding device 64 such that a total contact area of the wafers 48 with the wafer holding device 64 is minimized.

The wafer holding device 64 has a clamp element 246. The wafer holding device 64 preferably has a plurality of clamp elements 246. The clamp elements 246 are configured for retaining objects 128 and/or wafers 48 by means of a clamping action. The clamp elements 246 make contact, for retention purposes, with the object 128 and/or the wafer 48 on two opposite sides, in particular on a top side of the object 128 and on a bottom side of the object 128. Each object 128, or each wafer 48, is retained by means of a plurality of clamp elements 246. The plurality of clamp elements 246 for retaining an object 128 make contact with the object in each case at mutually spaced-apart points of the object 128. The plurality of clamp elements 246 for retaining an object 128 are arranged so as to be distributed in a circumferential direction around the object 128. It is alternatively conceivable for the object 128 and/or the wafer 48 to be retained not by means of clamping but exclusively by virtue of the object 128 and/or the wafer 48 lying on the clamp elements 246, which preferably have a holding region adapted to an outer shape of the object 128 and/or of the wafer 48. The wafer holding device 64 is arranged in the interior 106 of the wafer transport container 22. The wafer holding device 64 is fixedly connected to the wafer transport container opening element 92 of the wafer transport container 22. A movement of the wafer transport container opening element 92 causes a movement of the wafer holding device 64 and of the wafers 48 retained therein.

The wafer holding device 64 comprises an alternative and/or additional sensor module 14'. The alternative and/or additional sensor module 14' comprises a sensor 12'. The sensor 12' of the alternative and/or additional sensor module 14' is arranged in the wafer holding device 64. The wafer holding device 64 at least partially encompasses the sensor 12' of the alternative and/or additional sensor module 14'. The sensor 12' of the alternative and/or additional sensor module 14' is arranged at a point of the wafer holding device 64 which is configured for making physical contact with a wafer 48. The sensor 12' is arranged on and/or in a clamp element 246 of the wafer holding device 64. The sensor module 14' is embodied partially integrally with the wafer holding device 64, in particular at least one of the clamp elements 246. The wafers 48 stored in the wafer holding device 64 may be divided into sub-groups. The sensor 12' of the alternative and/or additional sensor module 14' may be assigned to one sub-group of wafers 48 stored in the wafer transport container 22. The sensor 12' of the alternative and/or additional sensor module 14' is configured for determining at least one parameter of that sub-group of wafers 48 which is assigned to the sensor 12'. The sensor 12' of the alternative and/or additional sensor module 14' may be assigned to exactly one wafer 48, in particular to exactly the topmost wafer 48 of the wafers 48 retained in the wafer holding device 64. The sensor 12' of the alternative and/or additional sensor module 14' is configured for determining at least one parameter of that wafer 48 which is assigned to the sensor 12'.

The alternative and/or additional sensor module 14' comprises a further sensor 32'. The further sensor 32' of the alternative and/or additional sensor module 14' is arranged in the wafer holding device 64. The further sensor 32' of the alternative and/or additional sensor module 14' is arranged at a side of the wafer holding device 64 which is averted from the wafers 48 retained by the wafer holding device 64. The alternative and/or additional sensor module 14' comprises an additional further sensor 38'. The additional further sensor 38' of the alternative and/or additional sensor module 14' is arranged on a surface of the wafer holding device 64. The additional further sensor 38' of the alternative and/or additional sensor module 14' is implemented as a passive sensor. The passive sensor is implemented as a color indicator plate. The passive sensor is configured for changing its surface color in the event of a change in a parameter monitored by the passive sensor.

The wafer transfer unit 90 has at least one alternative and/or additional sensor 12". The alternative and/or additional sensor 12" is embodied as a camera system. The camera system comprises a camera 156. The camera 156 has a data transfer element 58 of the data transfer unit 144. The alternative and/or additional sensor 12" is configured for reading at least the passive sensor. The sub-component of the wafer transfer system 16, which is illustrated here by way of example as wafer transport container 22, has a viewing window 158. The viewing window 158 is embodied as a transparent pane. The viewing window 158 is configured to permit a field of vision into an interior of the sub-component of the wafer transfer system 16, in particular into the interior 106 of the wafer transport container 22. The camera 156 is arranged outside the wafer transport container 22. Alternatively or in addition, the alternative and/or additional sensor 12", in particular the camera 156, may also be arranged at least partially within the sub-component of the wafer transfer system 16, in particular in the interior 106 of the wafer transport container 22. The camera 156 is configured for detecting, or observing, the interior 106 of the transport container 22 through the viewing window 158. The viewing window 158 is preferably implemented so as to enable all wafers 48 situated in the interior 106 of the wafer transport container 22 to be observed from the outside. In particular, the viewing window 158 has, in a circumferential direction of the wafer transport container 22, an extent of at least 1 cm, preferably at least 3 cm, preferably at least 5 cm and particularly preferably at most 10 cm. In particular, the viewing window 158 has an extent perpendicular to the circumferential direction of the wafer transport container 22 which corresponds to at least 50%, preferably at least 75%, preferably at least 85% and particularly preferably at most 95% of the total extent of the wafer transport container 22 perpendicular to the circumferential direction.

The alternative and/or additional sensor 12" is configured for capturing a part of the outer shape of at least one wafer 48. The alternative and/or additional sensor 12" is configured for capturing a bulge of wafers 48. An image field of the camera 156 of the alternative and/or additional sensor 12" is oriented at least substantially perpendicular to a storage plane of wafers 48 in the wafer holding device 64. The expression "substantially perpendicular" is intended here to define an orientation of a direction relative to a reference direction, wherein the direction and the reference direction, viewed in particular in one plane, enclose an angle of 90°, and the angle has a maximum deviation of in particular less than 8°, advantageously less than 5° and particularly advantageously less than 2°.

The outer shape of the wafer 48 detected by the alternative and/or additional sensor 12" realizes an outer shape of the wafer 48. Nominal outer shapes of wafers 48 are stored in the memory module 50 of the data processing unit 10. The data processing unit 10 is configured for comparing the detected outer shape of the wafer 48 with the nominal outer shape of the wafer 48. Detected deviations of the outer shape of a wafer 48 which overshoot a particular threshold value are output by the data processing unit 10 by means of the data transfer unit 144 to an operator and/or to the alarm module 94 of the associated sub-component of the wafer transfer system 16.

The alternative and/or additional sensor 12" is configured for detecting a position of the wafer 48 within the sub-component of the wafer transfer system 16, which is implemented by way of example as wafer transport container 22. A position of the wafer 48 detected by the alternative and/or additional sensor 12" takes the form of an actual position of the wafer 48. Nominal positions of wafers 48 for sub-components of the wafer transfer system 16 are stored in the memory module 50 of the data processing unit 10. The data processing unit 10 is configured for comparing the detected actual position of the wafer 48 with the nominal position of the wafer 48 within the sub-component of the wafer transfer system 16. Detected deviations of the position of a wafer 48 which overshoot a particular threshold value are output by the data processing unit 10 by means of the data transfer unit 144 to an operator and/or to the alarm module 94 of the associated sub-component of the wafer transfer system 16.

With regard to further characteristics or associations of the sensors 12', 32', 38' of the alternative and/or additional sensor module 14', reference is made to the description of the sensors 12, 32, 38 of the sensor module 14.

The wafer transport container 22 has a tempering unit 96. The tempering unit 96 is configured for tempering at least one object 128 stored in the wafer transport container 22 on the basis of sensor data of a sensor 12, 32, 38 implemented as a temperature sensor. The tempering unit 96 is configured for heating the object 128.

The tempering unit 96 is configured for cooling the object 128. The tempering unit 96 is configured for keeping the object 128 at a particular temperature. The temperature is predefined by the control and/or regulation unit 34 and/or the central control and/or regulation unit 108.

The tempering unit 96 has a tempering element 98. The tempering element 98 is implemented as a heating element. Alternatively or in addition, the tempering element 98 is implemented as a cooling element. The tempering element 98 is configured for permitting a heat flow between the object 128 and the tempering unit 96. The tempering element 98 makes physical contact with the object 128 that is to be tempered by the tempering unit 96. The tempering unit 96 preferably has a plurality of tempering elements 98. It is conceivable that respectively one portion of the tempering elements 98 is configured only for heating and one portion of the tempering elements 98 is configured only for cooling, and/or that the tempering elements 98 are at least partially configured for heating and cooling operation simultaneously. The tempering unit 96 is implemented integrally with the wafer holding device 64. The tempering element 98 is implemented integrally with at least one of the clamp elements 246 of the wafer holding device 64.

The tempering unit 96 is configured for separately tempering two objects 128 stored in the wafer transport container 22. The tempering unit 96 is configured for separate tempering of more than two objects 128 stored in the wafer transport container 22. Individual tempering elements 98 of the tempering unit 96 are, for this purpose, assigned exclusively to individual objects 128 which are to be tempered.

FIG. 3 shows a schematic view of the measuring technology unit 40. The measuring technology unit 40 has the sensor module 14. Additionally, the measuring technology unit 40 is connected to the alternative and/or additional sensor module 14'. A connection between the measuring technology unit 40 and the alternative and/or additional sensor module 14' is produced by means of the quick-coupling device 44 of the wafer transfer unit 90. Here, a plug-type connection between the measuring technology unit 40 and the alternative and/or additional sensor module 14' is closed. The sensors 12', 32' of the alternative and/or additional sensor module 14' each have an NFC interface 80. The sensors 12', 32' of the alternative and/or additional sensor module 14' each have a transmitter module 124. The transmitter module 124 is configured for wireless transmission of sensor data of the sensors 12', 32'. The sensors 12', 32' of the alternative and/or additional sensor module 14' each have a receiver module 126. The receiver module 126 is configured for receiving wirelessly transmitted instructions to the sensors 12', 32'.

In the embodiment shown in FIG. 3, the measuring technology unit 40 is implemented separately from the central control and/or regulation unit 108. As indicated by the double arrow and the dashed connecting lines, the measuring technology unit 40 is however in contact with the central control and/or regulation unit 108, wherein the contact may take the form of a connection by means of a physical data line and/or a wireless connection. The central control and/or regulation unit 108 has a separate energy store 68.

FIG. 4 shows a flow diagram of a method for coupling the wafer transport container 22 to the loading and/or unloading station 24. In at least one method step 162, the wafer transport container 22 is docked on a top side of the loading and/or unloading station 24. Here, the wafer transport container 22 is delivered by the wafer transport container transport system 26 to the loading and/or unloading station 24 and is set down on the loading and/or unloading station 24. Furthermore, here, a vacuum-type connection is produced between the wafer transport container 22 and the loading and/or unloading station 24 by means of a vacuum clamping device (not shown). In at least one further method step 164, the wafer transport container 22 is opened by the attachment of the wafer transport container opening element 92. Here, a vacuum in the interior 106 of the wafer transport container 22 is maintained. In at least one further method step 166, the mini-environment is implemented by the interior 106 of the wafer transport container 22 and the interior 138 of the loading and/or unloading station 24. In at least one further method step 168, a parameter of the mini-environment, of the interior 106 of the wafer transport container 22 and/or of the interior 138 of the loading and/or unloading station 24 is detected by the sensors 12, 32, 38 of a sensor module 14 assigned to the wafer transport container 22 and/or to the loading and/or unloading station 24.

FIG. 5 shows a flow diagram of a method for a wireless supply of energy to energy store 68 of the wafer transfer unit 90. In at least one method step 170, a sub-component of the wafer transfer system 16 is brought into the proximity of an energy transmitter element 54 of the charging module 66. In at least one further method step 180, the movement of the sub-component of the wafer transfer system 16 into the proximity of the energy transmitter element 54 is detected by the charging module 66. In at least one further method step 172, an energy transmission mode of the energy transmitter element 54 is activated. Here, energy is wirelessly radiated from the energy transmitter element 54 into a proximity of the energy transmitter element 54. In at least one further method step 174, an energy receiving mode of the energy receiver element 56 is activated. Here, the energy receiver element 56 at least partially absorbs the energy radiated by the energy transmitter element 54. The radiated energy is present in the form of electromagnetic radiation, for example light or relatively low-energy EM waves. In at least one further method step 176, the energy absorbed by the energy receiver element 56 is converted by the charging module 66 into electrical energy. In at least one further method step 182, the received electrical energy is stored in an energy store 68 on the side of the energy receiver element 56. In at least one further method step 178, the sub-component of the wafer transfer system 16 is removed from the energy transmitter element 54 of the charging module 66. Here, the wireless charging process is interrupted.

FIG. 6 shows a flow diagram of a method for checking geometrical deviations of a wafer 48 within the wafer transfer system 16. In at least one method step 184, a measurement of an outer shape and/or of a position of a wafer 48 is performed by means of the sensor 12" of the alternative and/or additional sensor module 14'. Here, an actual outer shape and/or an actual position is determined. In at least one further method step 186, a memory module 50 assigned to the alternative and/or additional sensor module 14', for example a memory module 50 of the data processing unit 10, in particular the memory module 50 of the central control and/or regulation unit 108 and/or a memory module 50 of the measuring technology unit 40 is interrogated. By means of the interrogation, the nominal position and/or the nominal outer shape are/is loaded into a buffer memory. In at least one further method step 188, a comparison of the actual position and of the nominal position and/or of the actual outer shape and of the nominal outer shape is performed. In at least one further method step 194, a deviation of the actual position from the nominal position and/or of the actual outer shape from the nominal outer shape is determined. In at least one further method step 196, the deviation is compared with a threshold value. In at least one further method step 192, the deviation is displayed on a display element, for example a screen. In at least one further method step 190, in the event of an overshooting of the threshold value, an alarm module 94 is activated. Here, an acoustic and/or an optical warning is output.

FIG. 7 shows a flow diagram of a method for a read of sensor data. In at least one method step 198, a sub-component of the wafer transfer system 16 is moved into the proximity of a read point 86. Here, the sub-component of the wafer transfer system 16 is for example moved by means of the wafer transport system 26 along the rail system 110, which has read points 86. In at least one further method step 200, the sub-component of the wafer transfer system 16 in the proximity of the read point 86 is detected by the reader device 82. In at least one further method step 202, a read command is activated and transmitted by the reader device 82. In at least one further method step 212, the read command is received by an NFC interface 80 of the sub-component of the wafer transfer system 16 and/or via a data transfer element 58 of the sub-component of the wafer transfer system 16. In at least one further method step 204, the sub-component of the wafer transfer system 16 transmits sensor data demanded in reaction to the receipt of the read command. In at least one further method step 210, charging of an energy store 68 of the sub-component of the wafer transfer system 16 is performed in reaction to the receipt of the read command. Here, energy transmitted by the reader device 82 is absorbed by the sub-component of the wafer transfer system 16. The reader device 82 is in this case embodied integrally with the charging module 66. In at least one further method step 206, sensor data of the sub-component of the wafer transfer system 16 that have been transmitted are internally labelled in order to prevent resending. In at least one further method step 208, the wireless data connection of the sub-component of the wafer transfer system 16 to the reader device 82 is severed, for example as a result of a removal of the sub-component of the wafer transfer system 16 from the proximity of the read point 86.

FIG. 8 is a flow diagram of a method for a control of the wafer transfer system 16. In at least one method step 214, at least one parameter and/or sensor dataset is determined by means of a sensor 12, 12', 12", 32, 32', 38, 38' of a sensor module 14, 14'. In at least one further method step 232, the parameter and/or sensor dataset is transmitted to the prediction module 30. In at least one further method step 234, pattern recognition is performed on the basis of the transmitted parameter and/or sensor dataset. The pattern recognition is then taken into consideration for the generation of the prediction in the method step 238. In at least one further method step 236, a comparison of multiple parameters and/or sensor datasets is performed. The comparison is then taken into consideration for the generation of the prediction in the method step 238. In at least one method step 238, a prediction for a future event and/or result is generated on the basis of the sensor dataset and/or of the parameter, in particular taking into consideration the prior comparison and/or the prior pattern recognition.

In at least one further method step 216, the parameter and/or the sensor dataset is transmitted to the evaluation module 52. In at least one further method step 222, sensor data, in particular sensor datasets, predictions and/or parameters are compared with one another. In at least one further method step 218, automatic fault detection is performed on the basis of the received sensor data and/or parameters. In at least one further method step 220, a control and/or regulation command is generated on the basis of the prediction and/or the automatic fault detection and transmitted to the central control and/or regulation system 42 of the fab 140 and/or to the wafer transport container transport system 26. In at least one further method step 240, the prediction, the automatic fault detection and the resulting control and/or regulation reaction is processed by the machine learning module 36. Here, the prediction, the automatic fault detection and the resulting control and/or regulation reaction are analyzed and conclusions are drawn. On the basis of the conclusions of the machine learning module 36, future predictions, fault detections and/or control and/or regulation reactions may possibly be refined, optimized and/or modified. In at least one further method step 242, the refined, optimized and/or modified predictions, fault detections and/or control and/or regulation reactions are transmitted to the prediction module 30, the evaluation module 52 and/or the central control and/or regulation system 42 of the fab 140.

In at least one further method step 224, a sequence of wafer transport containers 22 for delivery to the loading and/or unloading station 24 is specified on the basis of sensor data of the sensor modules 14 of the wafer transport containers 22. Here, a wafer transport container 22 whose sensor data lie outside a safe data range and/or whose prediction predicts a premature deviation of the sensor data from a safe data range is delivered preferentially, and/or the wafer transport container 22 is allocated a new space, situated further forward, in a sequence. In at least one further method step 226, a wafer transport container 22 whose sensor data lie outside a safe data range and/or whose prediction predicts a deviation of the sensor data from a safe data range is, by means of the wafer transport container transport system 26, diverted to the regeneration station 70, to the diagnostics station 46 and/or to the wafer check station 116.

In at least one further method step 230, a dataset of all sensor data transmitted by the wafer transfer units 90 is collected. Subsequently, in at least one further method step 244, the dataset of all sensor data transmitted by the wafer transfer units 90 is used for control and/or regulation of the wafer transport container transport system 26. In at least one further method step 228, the collected dataset of all sensor data transmitted by the wafer transfer units 90 is used for detecting, localizing and/or tracing at least one fault source.

REFERENCE DESIGNATIONS

10 Data processing unit
12 Sensor
14 Sensor module
16 Wafer transfer system
18 Wafer processing module
20 Wafer interface system
22 Wafer transport container
24 Loading and/or unloading station
26 Wafer transport container transport system
28 Wafer handling robot
30 Prediction module
32 Further sensor
34 Control and/or regulation unit
36 Machine learning module
38 Additional further sensor
40 Measuring technology unit
42 Central control and/or regulation system
44 Quick-coupling device
46 Diagnostics station
48 Wafer
50 Memory module
52 Evaluation module
54 Energy transmitter element
56 Energy receiver element
58 Data transfer element
60 Vacuum pump fastening unit
62 External pump station
64 Wafer holding device
66 Charging module
68 Energy store
70 Regeneration station
72 Conductive track 74 Photocell unit
76 Illumination unit
78 Photocell
80 NFC interface
82 Reader device
84 Vacuum pump exchange station
86 Read point
88 Charging energy supply module
90 Wafer transfer unit
92 Wafer transport container opening element
94 Alarm module
96 Tempering unit
98 Tempering element
100 Vacuum pump
102 Getter
104 Vacuum pump quick-coupling device
106 Interior
108 Central control and/or regulation unit
110 Rail system
112 Transport carriage
114 Rail
116 Wafer check station
118 Individual computer
120 Reloading station
122 Central computer
124 Transmitter module
126 Receiver module
128 Object
130 Gripper element
132 Accommodating element
134 Suspension unit
136 Holding cable
138 Interior
140 Wafer fabrication environment (fab)
142 Central communication unit
144 Data transfer unit
146 Wafer unloading station
148 Seal element
150 Housing unit
152 Assembly element
154 Drive unit
156 Camera
158 Viewing window
160 Inner wall
162 Method step
164 Method step
166 Method step
168 Method step
170 Method step
172 Method step
174 Method step
176 Method step
178 Method step
180 Method step
182 Method step
184 Method step
186 Method step
188 Method step
190 Method step
192 Method step
194 Method step
196 Method step
198 Method step
200 Method step
202 Method step
204 Method step
206 Method step
208 Method step
210 Method step
212 Method step
214 Method step
216 Method step
218 Method step
220 Method step
222 Method step
224 Method step
226 Method step
228 Method step
230 Method step
232 Method step
234 Method step
236 Method step
238 Method step
240 Method step
242 Method step
244 Method step
246 Clamp element

The invention claimed is:

1. A wafer transport container with a wafer transfer unit comprising at least one data processing unit which is configured at least for a registration and/or processing of sensor data of at least one sensor, allocated to at least one sub-component of a wafer transfer system, of a sensor module, in particular comprising at least one wafer processing module of the wafer transfer system, comprising at least one wafer interface system of the wafer transfer system with a wafer transport container and a loading and/or unloading station for a loading and/or unloading of the wafer transport container and/or of the wafer processing module, comprising at least one wafer transport container transport system of the wafer transfer system and/or comprising at least one wafer handling robot of the wafer transfer system, wherein the data processing unit has at least one prediction module, which is configured at least for generating, on the basis at least of sensor data of the sensor and/or on the basis of at least one parameter value determined by means of the sensor, a prediction for a future result and/or for a future event, by outputting of a machine-readable statement, and/or a statement which is noticeable by an operator, regarding a predicted quality of a wafer, a predicted period of time until a completion of the wafer, predicted expected process costs, predicted expected service lives of sub-components of the wafer transfer system and/or predicted expected readinesses for use of sub-components of the wafer transfer system, the wafer transfer unit having the at least one sensor module with the at least one sensor, the wafer transport container comprising at least one tempering unit, which is configured at least for tempering at least one object stored in the wafer transport container on the basis of sensor data of the at least one sensor, the at least one sensor being implemented as a temperature sensor, wherein the tempering unit has at least one tempering element, which makes physical contact with an object that is to be tempered by the tempering unit, and wherein the tempering unit of the wafer transport container is configured for separate tempering of at least two objects stored in the wafer transport container.

2. The wafer transport container as claimed in claim 1, further comprising at least one vacuum pump which is arrangeable on and/or in the wafer transport container, wherein the vacuum pump comprises at least one getter.

3. The wafer transport container as claimed in claim 2, comprising a releasable and/or exchangeable connection to the vacuum pump.

4. The wafer transport container as claimed in claim 2, comprising a vacuum-tight vacuum pump quick-coupling device, which is configured for a releasable and/or exchangeable coupling of the vacuum pump to an interior of the wafer transport container.

5. A wafer transport container with a wafer transfer unit comprising at least one data processing unit which is configured at least for a registration and/or processing of sensor data of at least one sensor, allocated to at least one sub-component of a wafer transfer system, of a sensor module, in particular comprising at least one wafer processing module of the wafer transfer system, comprising at least one wafer interface system of the wafer transfer system with a wafer transport container and a loading and/or unloading station for a loading and/or unloading of the wafer transport container and/or of the wafer processing module, comprising at least one wafer transport container transport system of the wafer transfer system and/or comprising at least one wafer handling robot of the wafer transfer system, wherein the data processing unit has at least one prediction module, which is configured at least for generating, on the basis at least of sensor data of the sensor and/or on the basis of at least one parameter value determined by means of the sensor, a prediction for a future result and/or for a future event, by outputting of a machine-readable statement, and/or a statement which is noticeable by an operator, regarding a predicted quality of a wafer, a predicted period of time until a completion of the wafer, predicted expected process costs, predicted expected service lives of sub-components of the wafer transfer system and/or predicted expected readinesses for use of sub-components of the wafer transfer system, the wafer transfer unit having the at least one sensor module with the at least one sensor, wherein the sensor module is configured at least for a separate capturing of a temperature of a first object stored in the wafer transport container and of a further temperature of a second object stored in the wafer transport container.

6. The wafer transport container as claimed in claim 5, further comprising at least one vacuum pump which is arrangeable on and/or in the wafer transport container, wherein the vacuum pump comprises at least one getter.

\* \* \* \* \*